(12) United States Patent
Asano et al.

(10) Patent No.: US 9,083,402 B2
(45) Date of Patent: Jul. 14, 2015

(54) HIGH FREQUENCY CIRCUIT AND HIGH FREQUENCY MODULE INCLUDING THE SAME

(71) Applicant: Sharp Kabushiki Kaisha, Osaka-shi, Osaka (JP)

(72) Inventors: Hiroyuki Asano, Osaka (JP); Shingo Oishi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/381,865

(22) PCT Filed: May 2, 2013

(86) PCT No.: PCT/JP2013/062746
§ 371 (c)(1),
(2) Date: Aug. 28, 2014

(87) PCT Pub. No.: WO2013/168665
PCT Pub. Date: Nov. 14, 2013

(65) Prior Publication Data
US 2015/0055733 A1     Feb. 26, 2015

(30) Foreign Application Priority Data

May 11, 2012   (JP) ................................. 2012-109643

(51) Int. Cl.
*H04L 25/03*     (2006.01)
*H04B 1/04*     (2006.01)
(Continued)

(52) U.S. Cl.
CPC ............ *H04B 1/0475* (2013.01); *H03F 1/3205* (2013.01); *H03F 3/193* (2013.01); *H03F 3/21* (2013.01); *H04B 1/525* (2013.01);
(Continued)

(58) Field of Classification Search
CPC ............................. H03F 1/3247; H04L 27/368
USPC .......................................................... 375/297
See application file for complete search history.

(56) References Cited

U.S. PATENT DOCUMENTS 6,041,081 A * 3/2000 O et al. ........................ 375/297
6,351,504 B1 * 2/2002 Igarashi et al. ............... 375/349
(Continued)

FOREIGN PATENT DOCUMENTS

JP     10-28066 A     1/1998
JP     2000-323999 A     11/2000
(Continued)

*Primary Examiner* — Santiago Garcia
(74) *Attorney, Agent, or Firm* — Birch, Stewart, Kolasch & Birch, LLP

(57) ABSTRACT

A front-end circuit includes a power amplifier circuit, a low noise amplifier circuit, a connection switching circuit, a bypass circuit and an attenuation unit. The connection switching circuit switches connections in response to a control signal. The bypass circuit forms a bypass in response to a control signal. The attenuation unit includes a plurality of attenuation circuits. The plurality of attenuation circuits include attenuation circuits. In the case where an antenna terminal is electrically connected to the power amplifier circuit, the attenuation circuits attenuate a branch signal leaked from the transmission signal into a transfer line for transferring the reception signal in response to the control signal. In the case where the antenna terminal is electrically connected to the low noise amplifier circuit, the attenuation circuit attenuates the reception signal in the transfer line in response to the control signal.

18 Claims, 18 Drawing Sheets

(51) Int. Cl.
*H04B 1/525* (2015.01)
*H03F 3/193* (2006.01)
*H03F 3/21* (2006.01)
*H04L 27/36* (2006.01)
*H03F 1/32* (2006.01)

(52) U.S. Cl.
CPC ........ *H03F 1/3247* (2013.01); *H03F 2200/222* (2013.01); *H03F 2200/294* (2013.01); *H03F 2200/387* (2013.01); *H03F 2200/451* (2013.01); *H03F 2201/3215* (2013.01); *H04B 2001/0408* (2013.01); *H04L 27/368* (2013.01)

(56) References Cited

U.S. PATENT DOCUMENTS

| | | | |
|---|---|---|---|
| 2005/0104655 A1* | 5/2005 | Huber et al. | 330/51 |
| 2006/0009165 A1* | 1/2006 | Alles | 455/88 |
| 2006/0040629 A1* | 2/2006 | Nakayama et al. | 455/234.1 |
| 2006/0217085 A1* | 9/2006 | Eisenstadt et al. | 455/126 |
| 2007/0184790 A1 | 8/2007 | Gilberton et al. | |
| 2008/0122693 A1* | 5/2008 | Needham et al. | 342/368 |
| 2008/0166980 A1* | 7/2008 | Fukamachi et al. | 455/83 |
| 2009/0017772 A1* | 1/2009 | Kemmochi et al. | 455/73 |
| 2009/0109085 A1* | 4/2009 | Needham et al. | 342/174 |
| 2009/0207764 A1* | 8/2009 | Fukamachi et al. | 370/297 |
| 2009/0298455 A1* | 12/2009 | Takeuchi | 455/296 |
| 2011/0244820 A1* | 10/2011 | Khoini-Poorfard et al. | 455/255 |
| 2012/0306716 A1* | 12/2012 | Satake et al. | 343/841 |

FOREIGN PATENT DOCUMENTS

| | | |
|---|---|---|
| JP | 2006-87070 A | 3/2006 |
| JP | 2009-33598 A | 2/2009 |
| WO | 2007-522747 A | 8/2007 |
| WO | WO 2007/129716 A1 | 11/2007 |
| WO | 2012-74940 A | 4/2012 |

\* cited by examiner

|  | TX MODE | | | LNA MODE | BYPASS MODE |
|---|---|---|---|---|---|
|  | GAIN | ISOLATION | EVM | GAIN | GAIN |
| 802.11ac | 27dB | −40dB | 1.8% | 10dB | −12dB～−8dB |

FIG.5

|  | TX MODE | LNA MODE | BYPASS MODE |
|---|---|---|---|
| CONTROL SIGNAL V_TX | H | L | L |
| CONTROL SIGNAL V_RX | L | H | H |
| CONTROL SIGNAL V_LNA | L | H | L |
| CONNECTION SWITCHING CIRCUIT 13 | TX | RX | RX |
| POWER AMPLIFIER 11a | ON | OFF | OFF |
| LNA 12a | OFF | ON | OFF |
| BYPASS CIRCUIT 12b | ON | OFF | ON |
| FILTER CIRCUIT F1 | ON | OFF | OFF |
| FILTER CIRCUIT F2 | ON | OFF | ON |
| FILTER CIRCUIT F3 | ON | OFF | OFF |

FIG.6
(A)
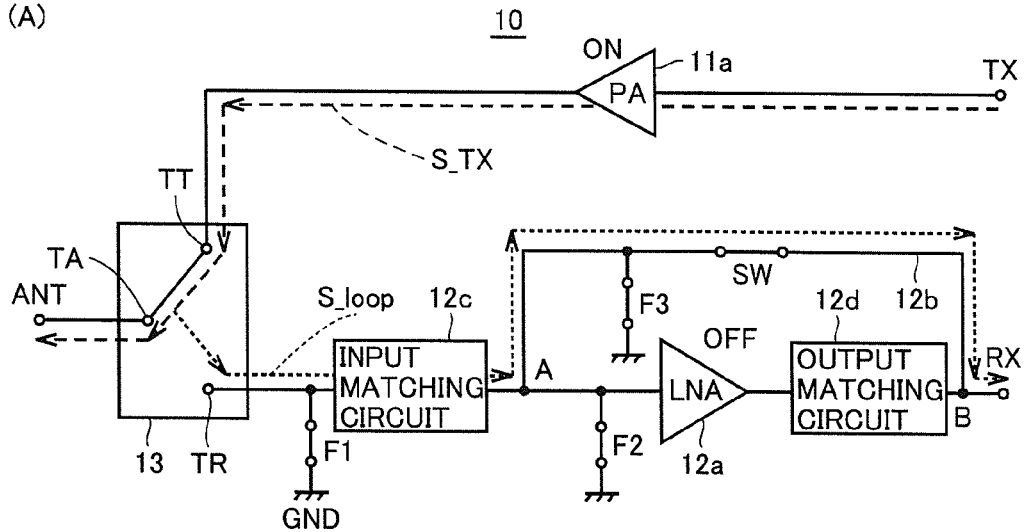
(B)
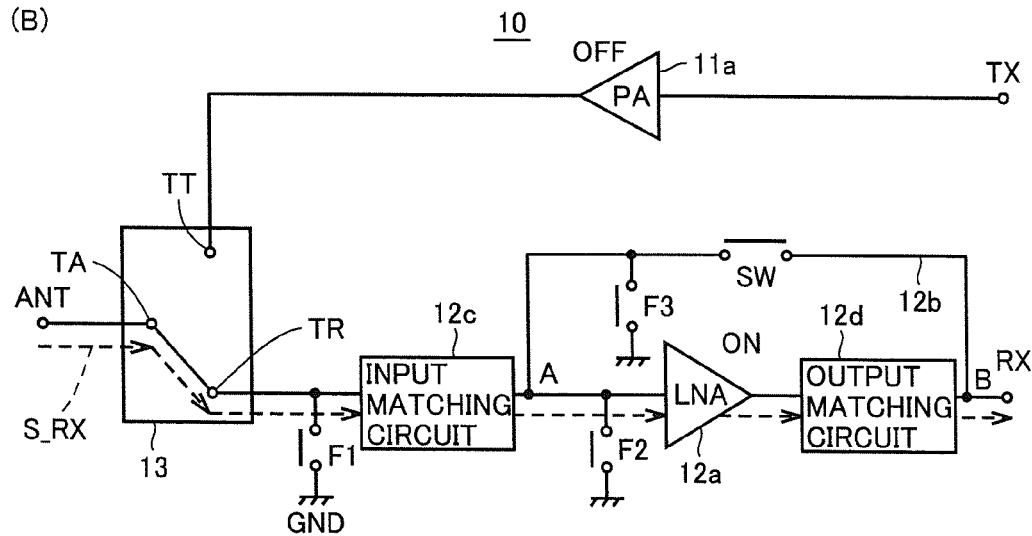
(C)
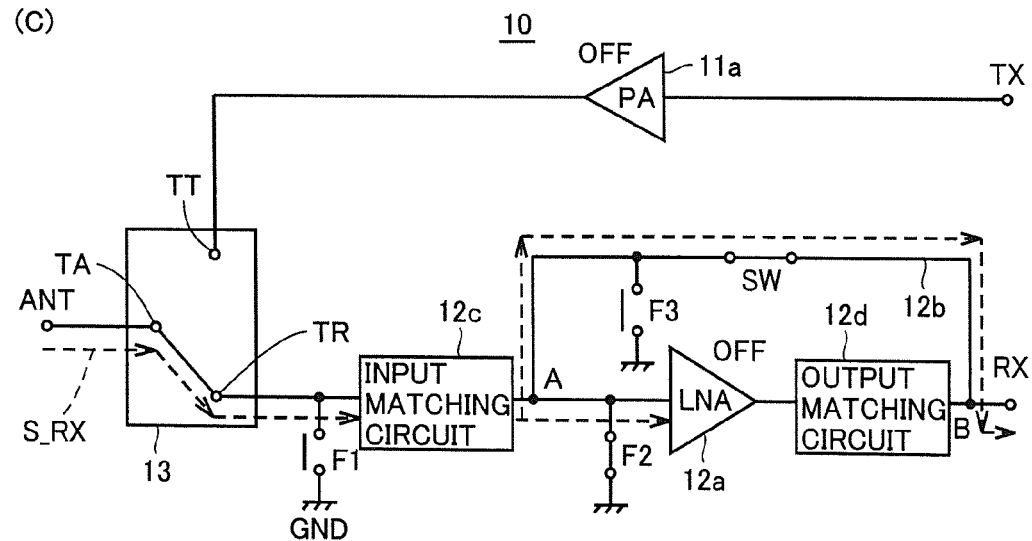

HIGH FREQUENCY CIRCUIT AND HIGH FREQUENCY MODULE INCLUDING THE SAME

TECHNICAL FIELD

The present invention relates to a high frequency circuit and a high frequency module including the same, and in particular relates to a high frequency circuit used in wireless communication and a high frequency module including the same.

BACKGROUND ART

Currently, data communication by wireless LAN (Local Area Network) is popular and is widely used in communication between electronic devices. The IEEE (The Institute of Electrical and Electronics Engineers) 802.11 standard, as a communication standard for wireless LAN, includes IEEE 802.11a/11b/11g/11n/11ac and the like. Among them, IEEE 802.11ac is attracting attention as the communication standard for wireless LAN of the next generation.

Electrical devices for performing data communication in wireless LAN in accordance with the IEEE 802.11ac standard, for example, is provided with a front-end circuit. The front-end circuit is connected to an antenna and configured to amplify both a transmission signal and a reception signal (PTD 1: WO 2007/129716).

FIG. 18 is a circuit block diagram illustrating the configuration of a conventional front-end circuit. With reference to FIG. 18, front-end circuit 100 is provided with a PA (Power Amplifier) 101a, an LNA (Low Noise Amplifier) 102a, a bypass circuit 102b, an antenna switch 103, a transmission terminal TX, a reception terminal RX, and an antenna terminal ANT.

PA 101a and LNA 102a each is an amplifier circuit configured to amplify a weak input signal and output the signal after amplification. PA 101a amplifies a signal received by transmission terminal TX. The signal amplified by PA 101a is output as a transmission signal. LNA 102a amplifies a reception signal received by antenna terminal ANT.

Bypass circuit 102b forms a bypass from a start point A provided between antenna switch 103 and the input terminal of LNA 102a to an end point B provided between the output terminal of LNA 102a and reception terminal RX. Bypass circuit 102b includes a switch SW which is a switch of SPST (Single Pole Single Throw) type. In front-end circuit 100, switch SW is controlled on or off to select whether to amplify the signal reaching start point A with LNA 102a or make the signal bypass LNA 102a via bypass circuit 102b.

Antenna switch 103 is a switch of SPDT (Single Pole Dual Throw) type. Antenna switch 103 includes a terminal TA, a terminal TT and a terminal TR. Terminal TA is connected to antenna terminal ANT. Terminal TT is electrically connected to transmission terminal TX. Terminal TR is electrically connected to reception terminal RX. Antenna switch 103 is switched to connect terminal TA to terminal TT in the transmission operation of front-end circuit 100 and connect terminal TA to terminal TR in the reception operation thereof.

First, the transmission operation of front-end circuit 100 will be described. Antenna switch 103 is switched to connect terminal TA to terminal TT. An RFIC (radio frequency integrated circuit) 200 outputs a signal to transmission terminal TX. The signal received by transmission terminal TX is amplified by PA 101a and is transferred from terminal TT to terminal TA TT inside antenna switch 103 as a transmission signal. After the transmission signal reaches antenna terminal ANT, it is transmitted out from antenna 300.

In the high frequency circuit disclosed in PTD 2 (Japanese Patent Laying-Open No. 2009-33598), a terminal is added to the antenna switch, and the signal strength of a reception signal input to LNA is increased or decreased by using the isolation feature of the antenna switch. With this configuration, the bypass circuit is no longer required.

In comparison to the conventional IEEE 802.11a/11b/11g/11n or the like, IEEE 802.11ac requires PA 101a to have a higher linearity. As the linearity of PA 101a is increased, the distortion of the transmission signal occurred upon amplification will be reduced. As a result, the modulation accuracy of the transmission signal will be improved. Generally, increasing the bypass voltage of PA 101a will improve the linearity of PA 101a. However, the attempt of improving the linearity of PA 101a simply by increasing the bypass voltage of PA 101a will increase power consumption in PA 101a. Therefore, the battery life of an electronic device provided with front-end circuit 100 will become shorter. Thereby, a technique called digital pre-distortion (hereinafter, referred to as DPD) in IEEE 802.11ac is generally used to cope with such problem.

FIG. 19 is a block diagram illustrating the concept of DPD. With reference to FIG. 19, in DPD, a distortion compensation circuit 104 and a coupler 105 are employed in addition to PA 101a. An input signal Sin is a transmission signal before being amplified by PA 101a. An output signal Sout is a transmission signal after input signal Sin is amplified by PA 101a.

In the case where the signal strength of input signal Sin is high, when input signal Sin is amplified by PA 101a, the distortion of the transmission signal will become great. To cope with this problem, distortion compensation circuit 104 is provided before PA 101a. A part of output signal Sout is branched by coupler 105, and the signal branched by coupler 105 is received by distortion compensation circuit 104. The branched signal is called a loopback signal S_loop. Distortion compensation circuit 104 generates a signal distorted in a direction opposite to the distortion occurred in loopback signal S_loop, combines the signal with input signal Sin, and outputs it as a distortion compensation signal Sp. Thus, the use of DPD makes it possible to obtain a transmission signal with a reduced distortion while inhibiting the power consumption from increasing.

However, typically, a coupler requires a transfer line to have a line length of $\lambda/4$ ($\lambda$: wavelength). Thus, in order to provide coupler 105 in the transfer line on a mounting substrate, the substrate is required to have a greater area. Nowadays, the presence of chip components of coupler 105 makes it possible to reduce the area of the substrate. However, in this case, along with the addition of new chip components, the material cost will increase.

FIG. 20 is a circuit block diagram illustrating the configuration and a transfer line for transferring signals of a conventional front-end circuit which uses the isolation feature of an antenna switch to branch a loopback signal. Note that a front-end circuit 110 illustrated in FIG. 20 is different from front-end circuit 100 illustrated in FIG. 18 in that front-end circuit 110 includes an antenna switch 113 to replace antenna switch 103. Since the other portions of front-end circuit 110 are identical to the corresponding portions of front-end circuit 100 in configuration, they will be denoted by the same reference signs and the description thereof will not be repeated.

A distortion compensation circuit 204 is provided in RFIC 200. A signal (indicated by a dashed line) output from distortion compensation circuit 204 is amplified by PA 101a, and reaches antenna switch 113. Since terminal TT and terminal TR are electrically insulated in antenna switch 113, when a transmission signal is transferred from terminal TT to terminal TA, most of the transmission signal will reach terminal TA. However, since the isolation between the transfer line for transferring the transmission signal from terminal TT to terminal TA and the transfer line for transferring the reception signal from terminal TT to terminal TR has a limit, a part of the transmission signal will leak to the transfer line for transferring the reception signal as the loopback signal (indicated by a dotted line). The leaked loopback signal bypasses LNA 102a via bypass circuit 102b, and is output to distortion compensation circuit 204 from reception terminal RX.

As described in the above, by using the isolation feature of antenna switch 113, it is possible to branch a loopback signal without adding coupler 105 and output the loopback signal to distortion compensation circuit 204.

Next, referring again to FIG. 18, the reception operation of front-end circuit 100 will be described. Antenna switch 103 is switched to connect terminal TA to terminal TR. The reception signal received by antenna 300 is output to antenna terminal ANT, and the reception signal received by antenna terminal ANT is transferred from terminal TA to terminal TR inside antenna switch 103. In order to perform a signal treatment of the reception signal in the subsequent RFIC 200, the reception signal should be confined within a range of appropriate signal strengths. Therefore, as the reception signal reaches start point A, the transfer line is switched in response to the signal strength.

In the case where the signal strength of the reception signal is low (in the case where the radio wave condition is poor), LNA 102a is turned on and switch SW is turned off. Thus, the reception signal is amplified by LNA 102a. The reception signal amplified by LNA 102a is output to RFIC 200 from reception terminal RX.

On the other hand, in the case where the signal strength of the reception signal is high (in the case where the radio wave condition is good), LNA 102a is turned off and switch SW is turned on. Thus, the reception signal bypasses LNA 102a via bypass circuit 102b. Thereby, the reception signal will not be amplified by LNA 102a. The reason therefor is that if the reception signal of a high signal strength is amplified by LNA 102a, the distortion will be caused to occur in the reception signal by LNA 102a and RFIC 200. The reception signal bypassed LNA 102a via bypass circuit 102b is output to RFIC 200 from reception terminal RX.

However, in the case where the signal strength of the reception signal is high, if the reception signal is simply made to bypass LNA 102a without being amplified by LNA 102a, the reception signal will not be constrained within the range of appropriate signal strengths. In order to meet the specific requirements prescribed in IEEE 802.11ac, generally it is necessary to attenuate the reception signal by about −15 dB to −5 dB.

CITATION LIST

Patent Document

PTD 1: WO 2007/129716
PTD 2: Japanese Patent Laying-Open No. 2009-33598

SUMMARY OF INVENTION

Technical Problem

The front-end module including therein a conventional front-end circuit is originally designed without the application of DPD. Therefore, if DPD is simply applied to the conventional front-end circuit, due to the insufficient isolation of antenna switch 113, the signal strength of the leaked loopback signal will increase. As the signal strength of the loopback signal increases, the distortion caused by LNA 102a to occur in the loopback signal also increases. Since the great distortion of the loopback signal will reduce the modulation accuracy of the transmission signal, it is undesirable. Thus, in order to prevent the signal strength of the loopback signal from increasing or prevent the distortion from increasing, it is necessary to attenuate the loopback signal until the signal strength thereof is constrained within the range of appropriate signal strengths. Moreover, in order to constrain the signal strength of the reception signal within the range of appropriate signal strengths, it is necessary to adjust the signal strength thereof by amplifying or attenuating the reception signal in response to the radio wave condition.

However, in the case where the loopback signal is branched by using the isolation feature of antenna switch 113, both the loopback signal and the reception signal are transferred through a common transfer line. Thereby, it is difficult to adjust the signal strength of both signals so as to constrain the signal strength of both signals within the respective range of appropriate signal strengths.

The present invention has been accomplished in view of the aforementioned problems, and it is therefore an object of the present invention to provide a front-end circuit capable of constraining both a loopback signal and a reception signal within the range of appropriate signal strengths of each.

Solution to Problem

A high frequency circuit according to one aspect of the present invention includes a power amplifier circuit configured to amplify a signal received by a transmission terminal and output it as a transmission signal, a low noise amplifier circuit configured to amplify a reception signal received by an antenna terminal and output the reception signal after amplification to a reception terminal, a connection switching circuit configured to switch a connection between the antenna terminal and the power amplifier circuit and a connection between the antenna terminal and the low noise amplifier circuit in response to a first control signal, a bypass circuit configured to form a bypass between the connection switching circuit and the reception terminal to bypass the low noise amplifier circuit in response to a second control signal, and an attenuation unit provided on a transfer line for transferring the reception signal. The attenuation unit includes a plurality of attenuation circuits. The plurality of attenuation circuits includes a first attenuation circuit configured to attenuate a branch signal leaked from the transmission signal into the transfer line for transferring the reception signal in response to the first control signal in the case where the antenna terminal is electrically connected to the power amplifier circuit by the connection switching circuit, and a second attenuation circuit configured to attenuate the reception signal in the transfer line in response to the second control signal in the case where the antenna terminal is electrically connected to the low noise amplifier circuit by the connection switching circuit.

Preferably, the bypass circuit includes a switch responsive to the second control signal and is configured to form the bypass from a start point provided between the connection switching circuit and the low-noise amplifier circuit. Each of the plurality of attenuation circuits is provided between the connection switching circuit and the start point or between the start point and the switch or between the start point and the low noise amplifier circuit.

Preferably, each of the first and second attenuation circuits includes a switching element provided between the transfer line and a ground node. The switching element electrically connects the transfer line to the ground node in response to a corresponding signal of the first and second control signals.

Preferably, the switching element is an FET, and each of the first and second attenuation circuits further includes a resistor provided between the gate of the FET and the ground node, a first capacitor provided between the drain of the FET and the transfer line, and a second capacitor provided between the source of the FET and the ground node. The drain of the FET receives a corresponding signal of the first and second control signals.

Preferably, each of the plurality of attenuation circuits further includes an inductor provided between the second capacitor and the ground node.

Preferably, the second capacitors provided respectively in at least two of the plurality of attenuation circuits are connected to each other at the side of the ground node. The attenuation unit further includes an inductor provided between the side of the ground node where the second capacitors are connected to each other and the ground node.

Preferably, the inductor is a bonding wire for mounting the high frequency circuit on a package.

Preferably, the plurality of attenuation circuits further include a third attenuation circuit configured to attenuate the branch signal together with the first attenuation circuit in response to the first control signal. The first attenuation circuit is provided between the connection switching circuit and the start point. The second attenuation circuit is provided between the start point and the low noise amplifier circuit. The third attenuation circuit is provided between the start point and the switch.

Preferably, the first attenuation circuit is provided between the connection switching circuit and the start point. The second attenuation circuit is provided between the start point and the low noise amplifier circuit.

Preferably, the first attenuation circuit is provided between the connection switching circuit and the start point. The second attenuation circuit is provided between the start point and the switch.

Preferably, the first and second attenuation circuits are provided between the connection switching circuit and the start point.

Preferably, the first and second attenuation circuits are provided between the start point and the switch.

Preferably, the first and second attenuation circuits are provided between the start point and the low noise amplifier circuit.

A high frequency module according to another aspect of the present invention is provided with the high frequency circuit mentioned above.

Preferably, the high frequency module further includes a distortion compensation circuit configured to receive from the reception terminal the branch signal attenuated by the first attenuation circuit. The distortion compensation circuit reduces the distortion of the transmission signal on the basis of the attenuated branch signal before outputting it to the transmission terminal and outputs the transmission signal after the distortion thereof is reduced to the transmission signal.

Preferably, the high frequency module further includes an HBT substrate on which the power amplifier circuit is provided, an HEMT substrate on which the low noise amplifier circuit and the connection switching circuit are provided, and a QFN package on which the high frequency circuit is mounted.

Advantageous Effects of Invention

According to the present invention, it is possible to obtain a high frequency circuit capable of constraining both a loop-back signal and a reception signal within the respective range of appropriate signal strengths.

BRIEF DESCRIPTION OF THE DRAWINGS

FIG. 5 is a diagram illustrating the controls in each operation mode of the high frequency circuit illustrated in FIG. 1;

FIG. 6 includes circuit block diagrams each illustrating a transfer line for transferring signals in each operation mode of the high frequency circuit illustrated in FIG. 1;

DESCRIPTION OF EMBODIMENTS

Figure 1:
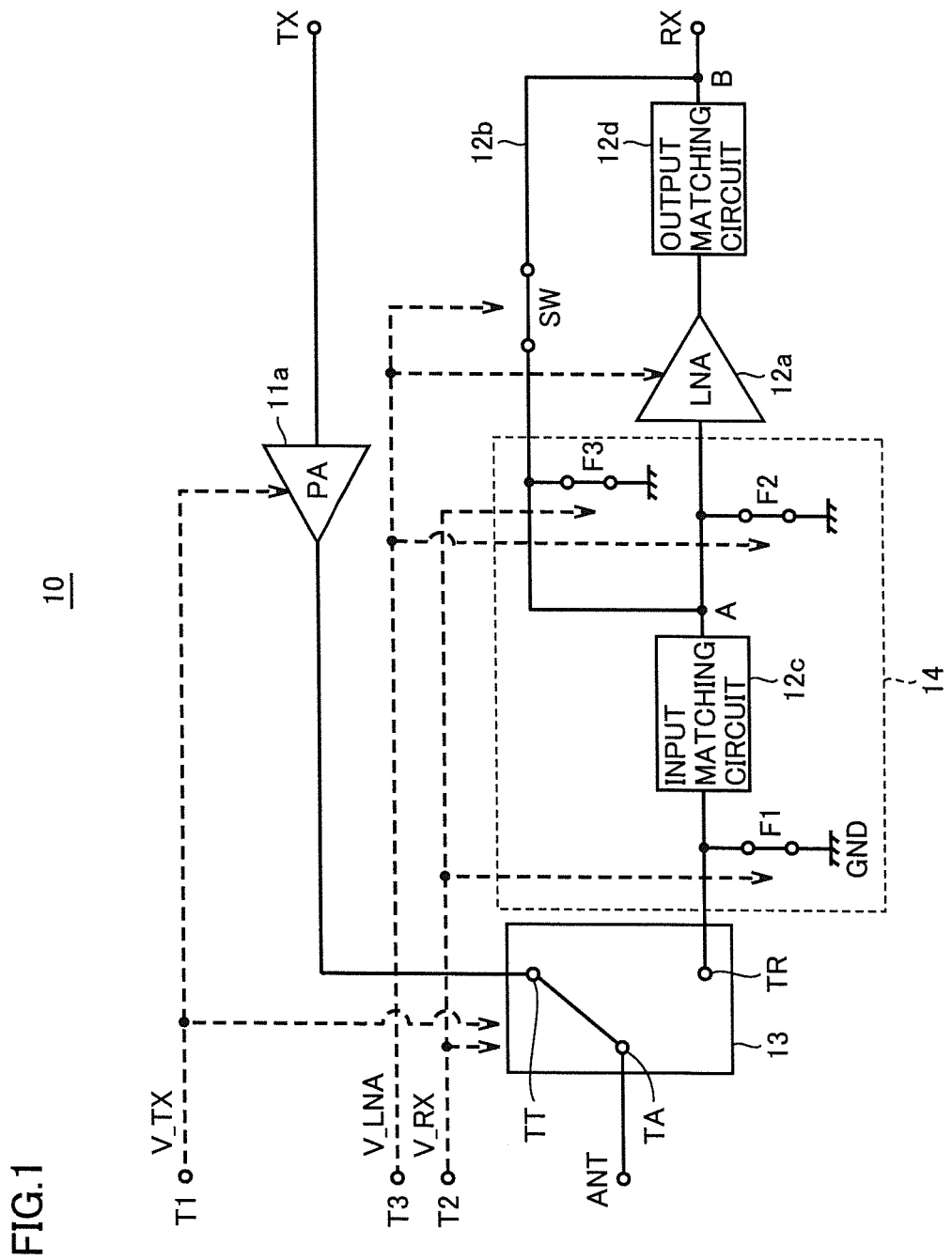
FIG. 1 is a circuit block diagram illustrating the configuration of a high frequency circuit according to a first embodiment of the present invention.

Hereinafter, embodiments of the present invention will be described in detail with reference to the drawings. It should be noted that the same or equivalent portions in the drawings will be denoted by the same reference signs and the description thereof will not be repeated.

The communication standard of wireless LAN in the 2.4 GHz band (such as IEEE 802.11b/11g/11n/11ac) and the 5 GHz band (such IEEE 802.11a/11n/11ac) have been prescribed in the IEEE 802.11 standards. In the specification, the embodiments will be described by using a front-end circuit (high frequency circuit) compatible with the 5 GHz band as an example.

First Embodiment

FIG. 1 is a circuit block diagram illustrating the configuration of a front-end circuit according to a first embodiment of the present invention.

Figure 2:
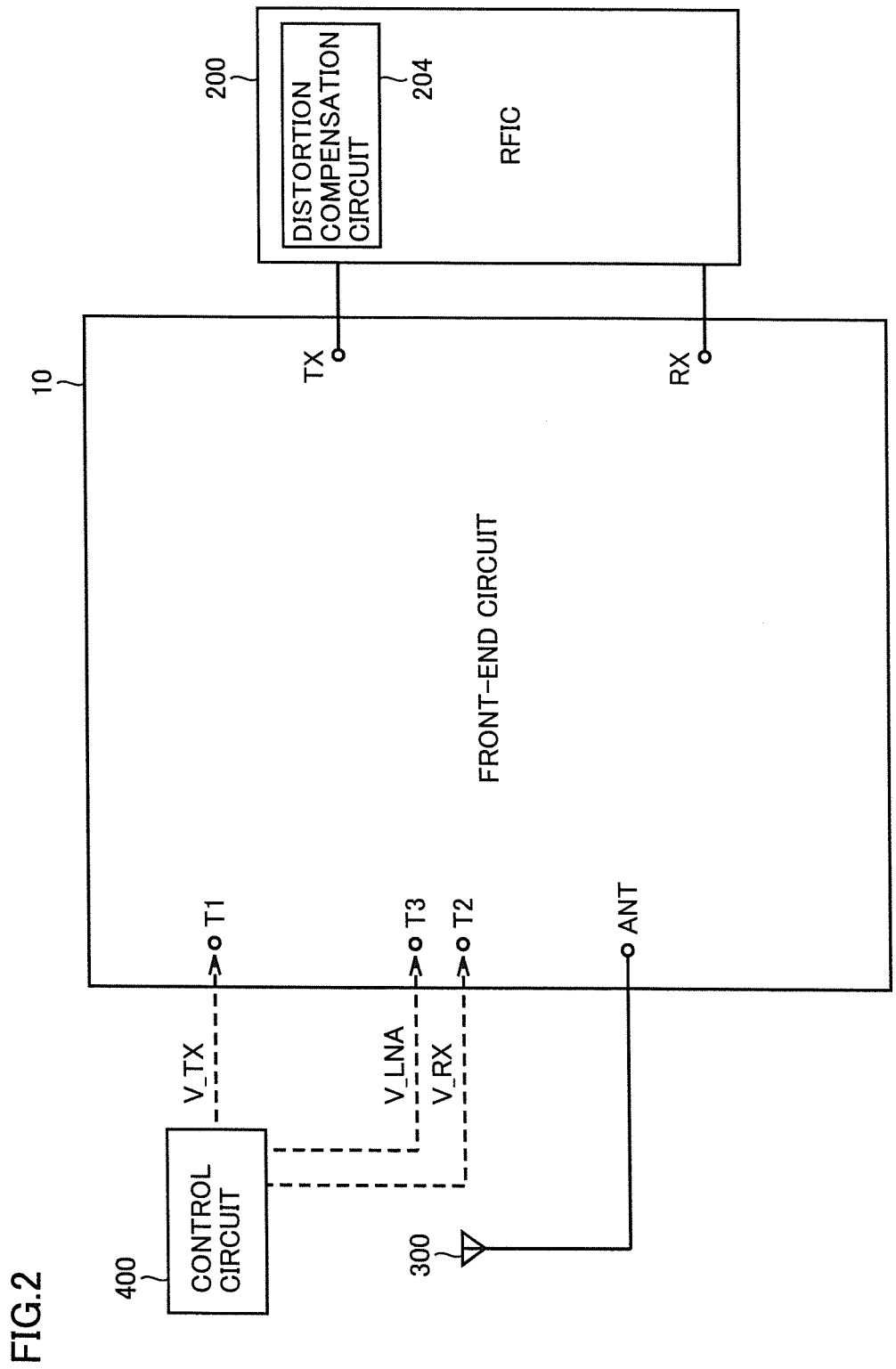
FIG. 2 is a circuit block diagram illustrating the connection of the high frequency circuit illustrated in FIG. 1 to an external circuit.

FIG. 2 is a circuit block diagram illustrating the connection of the front-end circuit illustrated in FIG. 1 to an external circuit.

With reference to FIGS. 1 and 2, a front-end circuit 10 is provided with a PA (power amplifier circuit) 11a, an LNA (low noise amplifier circuit) 12a, a bypass circuit 12b, an input matching circuit 12c, an output matching circuit 12d, an antenna switch (connection switching circuit) 13, an attenuation unit 14 (excluding input matching circuit 12c), a transmission terminal TX, a reception terminal RX, an antenna terminal ANT, and control terminals T1 to T3.

PA 11a and LNA 12a each is an amplifier circuit for amplifying a weak input signal and outputting the signal after amplification. PA 11a amplifies a signal received by transmission terminal TX. The signal amplified by PA 11a is output as a transmission signal. LNA 12a amplifies a reception signal received by antenna terminal ANT. The reception signal amplified by LNA 12a is output to reception terminal RX.

Bypass circuit 12b forms a bypass from a start point A provided between antenna switch 13 and the input terminal of LNA 12a to an end point B provided between the output terminal of LNA 12a and reception terminal RX. Bypass circuit 12b includes a switch SW. Switch SW is a switch of SPST type. In front-end circuit 10, switch SW is controlled by a control circuit 400 to select whether to amplify the signal reaching start point A with LNA 12a or make the signal bypass LNA 12a via bypass circuit 12b.

Input matching circuit 12c is provided between antenna switch 13 and start point A. Input matching circuit 12c matches an input impedance of front-end circuit 10 with that of an antenna 300. The output matching circuit 12d is provided between the end point B and the output terminal of LNA 12a. Output matching circuit 12d matches an output impedance of front-end circuit 10 with that of RFIC 200.

Antenna switch 13 is a switch of SPDT type. Antenna switch 13 includes a terminal TA, a terminal TT and a terminal TR. Terminal TA is connected to antenna terminal ANT. Terminal TT is electrically connected to transmission terminal TX. Terminal TR is electrically connected to reception terminal RX. Antenna switch 13 is switched by a control signal which will be described later so as to connect terminal TA to terminal TT in the transmission operation of front-end circuit 10 and connect terminal TA to terminal TR in the reception operation thereof.

Attenuation unit 14 includes an attenuation circuit F1 (first attenuation circuit), an attenuation circuit F2 (second attenuation circuit), and an attenuation circuit F3 (third attenuation circuit). Attenuation circuit F1 is provided between start point A and antenna switch 13. Attenuation circuit F2 is provided between start point A and LNA 12a. Attenuation circuit F3 is provided between start point A and switch SW.

RFIC 200 is connected to reception terminal RX and transmission terminal TX. RFIC 200 is provided with a distortion compensation circuit 204. Antenna 300 is connected to antenna terminal ANT. Control circuit 400 is connected to control terminals T1 to T3.

Each of control terminals T1 to T3 receives a corresponding control signal from control circuit 400. Control terminal T1 receives a control signal V_TX. Control terminal T2 receives a control signal V_RX (first control signal). Control terminal T3 receives a control signal V_LNA (second control signal). Control signal V_TX is used to control the on/off of PA 11a and to control the switching of antenna switch 13 so as to connect terminal TA to terminal TR. Control signal V_RX is used to control the switching of antenna switch 13 so as to connect terminal TA to terminal TT. Control signal V_LNA is used to control the on/off of LNA 12a and switch SW.

In addition, attenuation circuits F1 and F3 are wired to receive control signal V_RX, and attenuation circuit F2 is wired to receive control signal V_LNA. Thereby, the control signals mentioned above can be used to control not only the on/off of PA 11a, LNA 12a and switch SW but also the on/off of attenuation circuits F1 to F3.

Figures 3, 4:
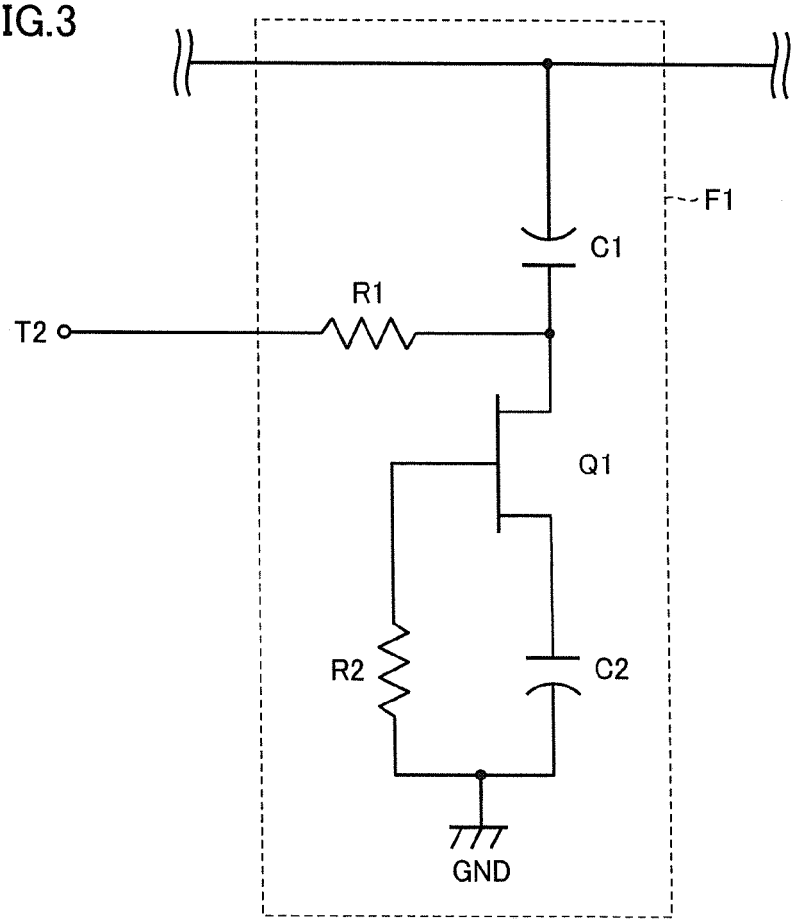
FIG. 3 is a circuit diagram illustrating the configuration of an attenuation circuit provided in the high frequency circuit illustrated in FIG. 1.
FIG. 4 is a diagram illustrating specific requirements prescribed in IEEE 802.11ac.

FIG. 3 is a circuit diagram illustrating the configuration of attenuation circuit F1 provided in the front-end circuit illustrated in FIG. 1. Since attenuation circuit F2 and attenuation circuit F3 are equivalent to attenuation circuit F1 in configuration, the description thereof will not be repeated.

Attenuation circuit F1 includes a switching element Q1, capacitors C1 and C2, and resistors R1 and R2. Switching element Q1 is a field effect transistor (FET) of normally-on type (D-mode). Switching element Q1 is provided between a transfer line for transferring a high frequency signal (loopback signal or reception signal) and a ground node GND. Resistor R2 is provided between the gate of the FET and ground node GND. Capacitor C1 (first capacitor) is provided between the drain of the FET and the transfer line for transferring the high frequency signal. Capacitor C2 (second capacitor) is provided between the source of the FET and ground node GND. The drain of the FET receives control signal V_RX from control terminal T2.

Capacitors C1 and C2 are DC-cut capacitors for preventing control signal V_RX from leaking to the transfer line for transferring the high frequency signal and to ground node GND, respectively. Resistor R1 is a damping resistor for stabilizing control signal V_RX.

When control signal V_RX is received by the drain of the FET as an L (low level) signal, attenuation circuit F1 is turned on. In this case, the high frequency signal transferred through the transfer line is released to ground node GND. Therefore, the high frequency signal can be attenuated by attenuation circuit F1. On the other hand, when control signal V_RX is received by the drain of the FET as an H (high level) signal, attenuation circuit F1 is turned off. In this case, the high frequency signal is transferred through the transfer line without being attenuated by attenuation circuit F1.

Front-end circuit 10 having the configuration as mentioned above operates in accordance with three operation modes called a TX mode, an LNA mode and a bypass mode. The TX mode is an operation mode for transferring the transmission signal by using DPD. The LNA mode is an operation mode for amplifying the reception signal by using LNA 12a in the case where the radio wave condition is poor and the signal strength of the reception signal is low. The bypass mode is an operation mode for forming a bypass allowing the reception signal to bypass LNA 12a via bypass circuit 12b without being amplified by LNA 12a in the case where the radio wave condition is good and the signal strength of the reception signal is high. As to be described in detail hereinafter, the specific requirements are prescribed differently in IEEE 802.11ac for each operation mode.

FIG. 4 is a diagram illustrating the specific requirements prescribed in IEEE 802.11ac. The TX mode is defined for the frequency band of 4.9 GHz to 5.9 GHz. The bypass mode and the LNA mode are defined for the frequency band of 5.15 GHz to 5.9 GHz.

With reference to FIG. 4, in the TX mode, in order to meet the specific requirements on the gain, the gain of PA 11a must be set to make the gain between transmission terminal TX and antenna terminal ANT equal to 27 dB or more. Further, in order to meet the specific requirements on the signal strength of the loopback signal, the isolation between the output terminal of PA 11a and reception terminal RX must be enhanced to −40 dB or less. Furthermore, in order to meet the specific requirements on the distortion of the loopback signal, the error vector magnitude (EVM) must be 1.8% or less.

Referring again to FIG. 1, in the case where a modulation signal without any distortion is input to the output terminal of PA 11a, the EVM may be determined by measuring the signal output from reception terminal RX. However, when all components of front-end circuit 10 are mounted inside a package, the EVM cannot be simply measured in this manner. In this case, the EVM is measured by using a direct or indirect approach to be mentioned below.

In the direct approach, a chip provided only with LNA 12a and switch SW is mounted on a package, and the EVM between terminal TT of antenna switch 13 and reception terminal RX is measured. On the other hand, in the indirect method, firstly, all components of front-end circuit 10 are mounted on a package, and the EVM between transmission terminal TX and antenna terminal ANT is measured. At this time, the reception terminal RX is terminated by a 50Ω (ohm) terminator. Next, the EVM between transmission terminal TX and reception terminal RX is measured. At this time, antenna terminal ANT is terminated by a 50Ω terminator. By comparing the two EVMs measured in this way, it is possible to estimate the magnitude of distortion to be superimposed in transferring the loopback signal between terminal TT of antenna switch 13 and reception terminal RX.

Further, in order to cope with the distortion of the transmission signal, the EVM must be 1.8% or less. In the case where a modulation signal without any distortion is input to transmission terminal TX, the EVM may be determined by measuring the signal output from antenna terminal ANT.

In the TX mode, LNA 12a is turned off, and the loopback signal is received by LNA 12a. Even though LNA 12a is turned off, if the signal strength of the loopback signal received by LNA 12a is high, a voltage capable of turning on LNA 12a may be applied between the gate and the source of an amplifier transistor included in LNA 12a. Thereby, a distortion is caused to occur in the loopback signal. Thus, it is necessary to sufficiently attenuate the loopback signal before it reaches LNA 12a.

While in the LNA mode, the gain between antenna terminal ANT and reception terminal RX must be 10 dB or more. In the bypass mode, the gain must be from −12 dB to −8 dB.

The attenuation of the reception signal so as to make it meet the specific requirements on the gain in the bypass mode, for example, may be achieved by providing a resistor in series connection to the transfer line to bypass circuit 12b. In this case, the component to be added is the resistor only, which is advantageous from the viewpoint of reducing the substrate area or the material cost. However, since this approach will increase the distortion of the high frequency signal, it is not preferable. Due to the newly added resistor, the impedance of LNA 12a relative to bypass circuit 12b will decrease relatively, and thereby, the power of the high frequency signal received by LNA 12a increases. As a result, the distortion of the high frequency signal increases.

As mentioned above, the specific requirements prescribed in IEEE 802.11ac are different for each operation mode. Therefore, it is necessary to adjust the amount of attenuation of the signal strength of the reception signal or the loopback signal for each mode. Hereinafter, the operations of front-end circuit 10 in each operation mode will be described with reference to FIGS. 5 and 6.

FIG. 5 is a diagram illustrating the controls of components in each mode of the front-end circuit illustrated in FIG. 1.

FIG. 6 includes circuit block diagrams each illustrating a transfer line for transferring signals in each operation mode of the high frequency circuit illustrated in FIG. 1. FIG. 6(A) illustrates a transfer line for transferring signals in the TX mode. FIG. 6(B) illustrates a transfer line for transferring signals in the LNA mode. FIG. 6(C) illustrates a transfer line for transferring signals in the bypass mode. In FIG. 6, the transfer line for transferring the transmission signal and the reception signal is indicated by a dashed line. The transfer line for transferring the loopback signal is indicated by a dotted line.

First, the transfer line for transferring the transmission signal and the loopback signal in the TX mode will be described with reference to FIGS. 5 and 6(A). In the TX mode, an H signal is output as control signal V_TX from control circuit 400 (see FIG. 2), an L signal is output as control signal V_RX therefrom, and an L signal is output as control signal V_LNA therefrom.

As the control signals reach control terminal T1 to T3, respectively, antenna switch 13 is switched to connect terminal TA to terminal TT. PA 11a is turned on, LNA 12a is turned off, bypass circuit 12b is turned on, and attenuation circuits F1 to F3 are all turned on.

Accordingly, the signal received by front-end circuit 10 from the distortion compensation circuit (see FIG. 2) is transferred in the sequence of transmission terminal TX, PA 11a (being turned on), terminal TT, terminal TA and antenna terminal ANT. During the transmission, a part of the transmission signal amplified by PA 11a leaks into the transfer line for transferring the reception signal as the loopback signal. The loopback signal is transferred in the sequence of terminal TR, attenuation circuit F1 (being turned on), input matching circuit 12c, start point A, attenuation circuit F2 (being turned on), switch SW, end point B and reception terminal RX. The loopback signal is output from reception terminal RX to the distortion compensation circuit (see FIG. 2).

Next, the transfer line for transferring the reception signal in the LNA mode will be described with reference to FIGS. 5 and 6(B). In the LNA mode, an L signal is output as control signal V_TX from control circuit 400 (see FIG. 2), an H signal is output as control signal V_RX therefrom, and an H signal is output as control signal V_LNA therefrom.

As the control signals reach control terminal T1 to T3, respectively, antenna switch 13 is switched to connect terminal TA to terminal TR. PA 11a is turned off, LNA 12a is turned on, bypass circuit 12b is turned off, and attenuation circuits F1 to F3 are all turned off.

Accordingly, the signal received by antenna terminal ANT is transferred in the sequence of antenna terminal ANT, terminal TA, terminal TR, attenuation circuit F1 (being turned off), input matching circuit 12c, start point A, attenuation circuit F3 (being turned off), LNA 12a (being turned on), output matching circuit 12d, end point B and reception terminal RX. The reception signal is output from reception terminal RX to the distortion compensation circuit (see FIG. 2).

Finally, the transfer line for transferring the reception signal in the bypass mode will be described with reference to FIGS. 5 and 6(C). In the bypass mode, an L signal is output as control signal V_TX from control circuit 400 (see FIG. 2), an H signal is output as control signal V_RX therefrom, and an L signal is output as control signal V_LNA therefrom.

As the control signals reach control terminal T1 to T3, respectively, antenna switch 13 is switched to connect terminal TA to terminal TR. Both PA 11a and LNA 12a are turned off, bypass circuit 12b is turned on, both attenuation circuits F1 and F3 are turned off, and attenuation circuit F2 is turned on.

Accordingly, the signal received by antenna terminal ANT is transferred in the sequence of antenna terminal ANT, terminal TA, terminal TR, attenuation circuit F1 (being turned off), input matching circuit 12c, start point A, attenuation circuit F2 (being turned off), switch SW (being turned on), end point B and reception terminal RX. The reception signal is output from reception terminal RX to the distortion compensation circuit (see FIG. 2).

As mentioned above, each of the attenuation circuits F1 to F3 is provided with a switching element, which makes it possible to turn on a different number of the attenuation circuits for each operation mode. The amount of attenuation of the high frequency signal is determined according to the number of attenuation circuits F1 to F3 being turned on. The number of the attenuation circuits to be turned on is determined so as to meet the specific requirements illustrated in FIG. 4 for each operation mode.

Specifically, in order to adjust the amount of attenuation of the high frequency signal in each of the three operation modes, at least two attenuation circuits must be provided. If two attenuation circuits are provided, it is possible to adjust the amount of attenuation of the high frequency signal in three ways through the on/off control of the switching elements so that (1) both attenuation circuits are turned on, (2) one attenuation circuit is turned on and the other is turned off, and (3) both attenuation circuits are turned off.

Front-end circuit 10 of the present embodiment is provided with three attenuation circuits. In the TX mode, attenuation circuits F1 to F3 are all turned on. Therefore, the amount of attenuation of the loopback signal is equivalent to the total amount of attenuation from three attenuation circuits. Thus, the amount of attenuation of the loopback signal in the TX mode is the largest in the amount of attenuation. In this way, the isolation between the transfer line for transferring the transmission signal and the transfer line for transferring the reception signal is enhanced at most. In addition, as a result of the attenuation on the loopback signal, the distortion of the loopback signal is also reduced.

In the LNA mode, attenuation circuits F1 to F3 are all turned off. Therefore, the reception signal will not be attenuated. In other words, in the case where the signal strength of a reception signal is low and thus is required to be amplified by LNA 12a, the reception signal will not be attenuated by attenuation unit 14.

In the bypass mode, only attenuation circuit F2 is turned on. Therefore, the amount of attenuation of the reception signal is equivalent to the amount of attenuation from one attenuation circuit. Thus, the amount of attenuation of the reception signal is smaller than the amount of attenuation of the loopback signal. In this way, the reception signal can be adjusted within the range of appropriate signal strengths.

As mentioned above, despite that the loopback signal and the reception signal are being transferred through a common transfer line, it is possible to adjust independently the amount of attenuation of the loopback signal and the amount of attenuation of the reception signal.

Hereinafter, that front-end circuit 10 actually meets the specific requirements illustrated in FIG. 4 will be described with reference to FIGS. 7 to 9. The simulation results are shown in FIGS. 7 to 9, and the simulation conditions are set in accordance with the provisions of IEEE 802.11ac.

Figure 7:
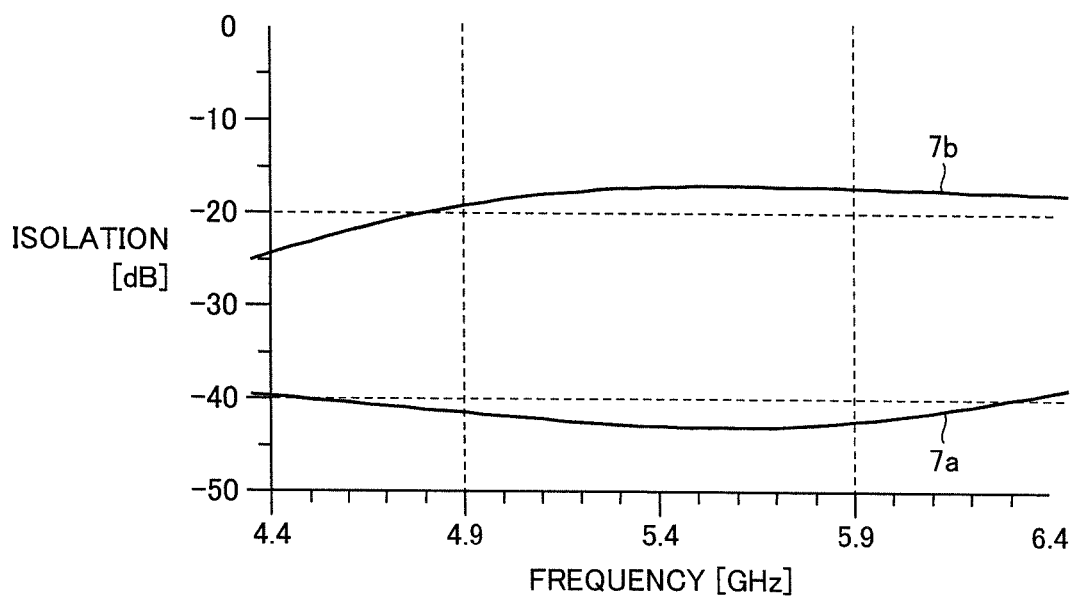
FIG. 7 is a diagram illustrating a simulation result about the dependence of isolation on frequency in a TX mode in the high frequency circuit illustrated in FIG. 1.

FIG. 7 is a diagram illustrating a simulation result about the dependence of isolation on frequency in the TX mode in front-end circuit 10 illustrated in FIG. 1. With reference to FIG. 7, the horizontal axis of the graph represents the frequency of a signal received by transmission terminal TX. The vertical axis of the graph represents the isolation. The isolation is a ratio between the signal strength of the transmission signal at the output terminal of PA 11a and the signal strength of the loopback signal at reception terminal RX. Waveform 7a represents the dependence of isolation on frequency in front-end circuit 10 according to the present embodiment. Waveform 7b represents the dependence of isolation on frequency in a conventional front-end circuit.

As illustrated by the specific requirements in FIG. 4, the isolation must be enhanced to −40 dB or less in the frequency band of 4.9 GHz to 5.9 GHz. The isolation of a conventional front-end circuit is −20 dB or more, while in front-end circuit 10 according to the present embodiment has been enhanced to −40 dB or less in the entire frequency band mentioned above. Therefore, the isolation of front-end circuit 10 meets the specific requirements illustrated in FIG. 4. Thus, through the provision of attenuation unit 14 including attenuation circuits F1 to F3, the loopback signal can be sufficiently attenuated.

Figure 8:
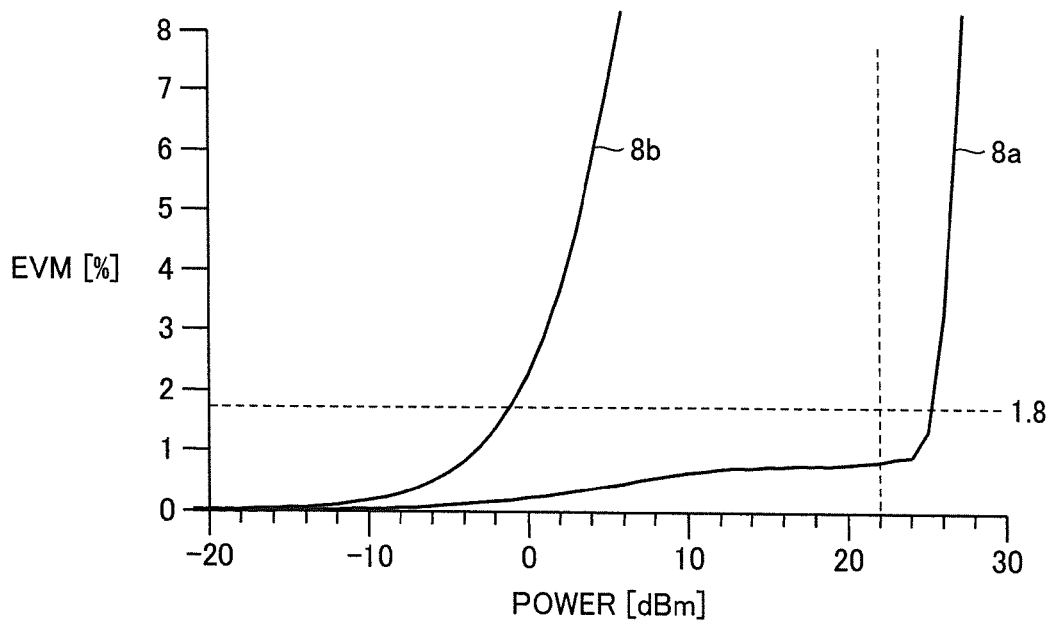
FIG. 8 is a diagram illustrating a simulation result about the dependence of EVM on power in a TX mode in the high frequency circuit illustrated in FIG. 1.
Figure 9:
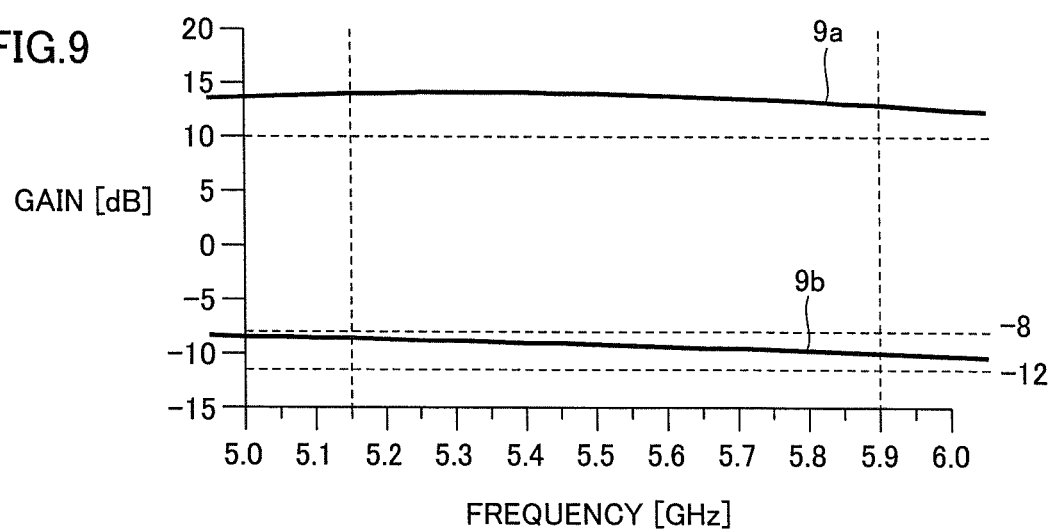
FIG. 9 is a diagram illustrating a simulation result about the gain in an LNA mode and a bypass mode in the high frequency circuit illustrated in FIG. 1.

FIG. 8 is a diagram illustrating a simulation result about the dependence of EVM on power in the TX mode in front-end circuit 10 illustrated in FIG. 1. With reference to FIG. 8, the horizontal axis of the graph represents the power of a modulation signal at the output terminal of PA 11a. The vertical axis of the graph represents EVM calculated from a modulated signal output by reception terminal RX in the case where the modulated signal without any distortion is input from the output terminal of PA 11a. The frequency of the input modulation signal is 5.4 GHz. Waveform 8a represents the EVM of front-end circuit 10. Waveform 8b represents the EVM of a conventional front-end circuit.

As illustrated by the specific requirements in FIG. 4, in the case where a modulated signal having the power of 22 dBm or less and without any distortion is input to the output terminal of PA 11, the EVM measured at reception terminal RX must be 1.8% or less. In the conventional front-end circuit, even though a modulation signal having the power of about 0 dBm is input, the EVM will become greater than 1.8%. However, in front-end circuit 10 of the present embodiment, in the case where a modulation signal having the power of 22 dBm is input, the EVM is less than 1.0%. Therefore, the EVM of front-end circuit 10 meets the specific requirements illustrated in FIG. 4. Thus, through the provision of attenuation unit 14 including attenuation circuits F1 to F3, the loopback signal can be sufficiently attenuated.

It should be noted that the value of 22 dBm is given merely as an example illustrating the power of the transmission signal. The range of the power of the transmission signal may be set appropriately in accordance with the power of the loopback signal defined based on the isolation.

The following facts can be seen from the simulation results illustrated in FIG. 8. For example, between transmission terminal TX and antenna terminal ANT, there is provided with a PA which has a linear output of 20 dBm (maintaining the EVM at 1.8% or less until the output is 20 dBm), the EVM reaches about 5% as the output is 22 dBm. It has been found that the distortion characteristic of the loopback signal has a good linearity until the output is 22 dBm. Thereby, when the output at antenna terminal ANT is 22 dBm, the distortion of 5%+α (the gain distortion is either positive or negative, or the phase distortion is either positive or negative) measured at reception terminal RX for the modulation signal can be approximately considered as being caused by the PA, and thus an inverse distortion can be added to either the gain distortion or the phase distortion. In other words, with the help of DPD, the PA having a linear output power of 20 dBm can be used with a good linearity up to 22 dBm. The linearity of PA is strongly dependent on the linear input (dBm) of the loopback signal.

FIG. 9 is a diagram illustrating a simulation result about the gains in the LNA mode and the bypass mode in front-end circuit 10 illustrated in FIG. 1. With reference to FIG. 9, the horizontal axis of the graph represents the frequency of the reception signal received by antenna terminal ANT. The vertical axis of the graph represents the gain between antenna terminal ANT and reception terminal RX. Waveform 9a represents the gain in the LNA mode. Waveform 9b represents the gain in the bypass mode.

As illustrated by the specific requirements in FIG. 4, in the frequency band of 5.15 GHz to 5.9 GHz, the gain in the LNA mode must be 10 dB or more and the gain in the bypass mode must be from −12 dB to −8 dB. In front-end circuit 10 of the present embodiment, the gain in the LNA mode is greater than 10 dB in the entire frequency band mentioned above, and the gain in the bypass mode is also confined in the range from −12 dB to −8 dB in the entire frequency band mentioned above. Therefore, the gain in either the LNA mode or the bypass mode of front-end circuit 10 meets the specific requirements illustrated in FIG. 4. Thus, through the provision of attenuation unit 14 including attenuation circuits F1 to F3, the reception signal can be adjusted so that the signal strength thereof is confined within the range of appropriate signal strengths.

As mentioned above, in the TX mode, attenuation circuits F1 to F3 are all turned on to attenuate the loopback signal. Therefore, it is possible to obtain the isolation meeting the specific requirements as prescribed in IEEE 802.11ac. As a result, the distortion of the loopback signal is also reduced, making it possible to obtain the EVM meeting the specific requirements. While in the LNA mode, attenuation circuits F1 to F3 are all turned off, preventing the loopback signal from being attenuated. Therefore, it is possible to obtain the gain meeting the specific requirements mentioned above. Further, in the bypass mode, only attenuation circuit F2 is turned on to attenuate the reception signal moderately. Therefore, it is possible to obtain the gain meeting the specific requirements mentioned above. Therefore, according to the present embodiment, it is possible to obtain front-end circuit which meets the specific requirements illustrated in FIG. 4 in all of the operation modes including the TX mode, the LNA mode and the bypass mode.

Note that in front-end circuit 10 according to the present embodiment, control signal V_RX is set as the first control signal. However, it is acceptable to set control signal V_TX as the first control signal. This is because that control signal V_TX and control signal V_RX are the H signal and the L signal constantly in an inverse relationship. However, in this case, PA 11a and attenuation circuits F1 and F3 are required to be modified so as to work properly in response to control signal V_TX. Based on the same reason as mentioned above, control signal V_TX and control signal V_RX may be combined into a single control signal.

In front-end circuit 10, three attenuation circuits are provided on the transfer line between antenna switch 13 and start point A, between start point A and switch SW, and between start point A and LNA 12a, respectively. However, regardless of the positions of the attenuation circuits, it is possible for the transfer line mentioned above to attenuate the high frequency signal transferred through the transfer line. The reason is that when an attenuation circuit is turned on, the impedance of the transfer line where the attenuation circuit is provided will decrease, and thereby the high frequency signal will be transferred to the attenuation circuit. Thus, the amount of attenuation of the high frequency signal is determined mainly by the number of the attenuation circuits not by the positions of the attenuation circuits.

However, from the viewpoint of reducing the distortion occurred in the loopback signal, the position of the attenuation circuit may influence the loopback signal. The main factor for causing a distortion to occur in the loopback signal is the linearity of a transistor. In the specification, the transistor refers to an amplifier transistor included in PA 11a, an amplifier transistor included in LNA 12a and a switching transistor included in switch SW (none of them is shown in figure). It is preferable to identify a transistor mainly responsible for causing a distortion to occur in the loopback signal and provide an attenuation circuit immediately before the transistor.

However, if multiple attenuation circuits are provided (between antenna switch 13 and LNA 12a) in the transfer line for transferring the reception signal to LNA 12a, the noise figure of LNA 12a may be deteriorated. This is because when an FET included in each of the attenuation circuits is turned on or off, the noise figure of LNA 12a may be deteriorated by the parasitic capacitance between the drain and the source of the FET.

As mentioned above, it is preferable to appropriately adjust the number and the arrangement of the attenuation circuits according to the transistor mainly responsible for causing a distortion to occur in the loopback signal in the TX mode, the noise figure of LNA 12a in the LNA mode and the like. For example, it is possible to arrange four attenuation circuits in such a way that one attenuation circuit is provided between antenna switch 13 and start point A, two attenuation circuits are provided between start point A and switch SW, and one attenuation circuit is provided between start point A and LNA 12a. The four attenuation circuits may be controlled in such a way that the four attenuation circuits are all turned on in the TX mode, the four attenuation circuits are all turned off in the LNA mode, and only two attenuation circuits provided between start point A and switch SW are turned on in the bypass mode.

Hereinafter, the front-end circuit with different arrangement and number of attenuation circuits will be described in a second embodiment to a sixth embodiment. In the following embodiments and modifications of the present invention, since the control of the front-end circuit is the same as or similar to that of front-end circuit 10 according to the first embodiment, the description thereof will not be repeated.

Second Embodiment

The second embodiment is different from the first embodiment in that attenuation unit 14 includes two attenuation circuits. In the second embodiment, the description will be carried out on that attenuation unit 14 includes two attenuation circuits provided at two positions, respectively.

Figure 10:
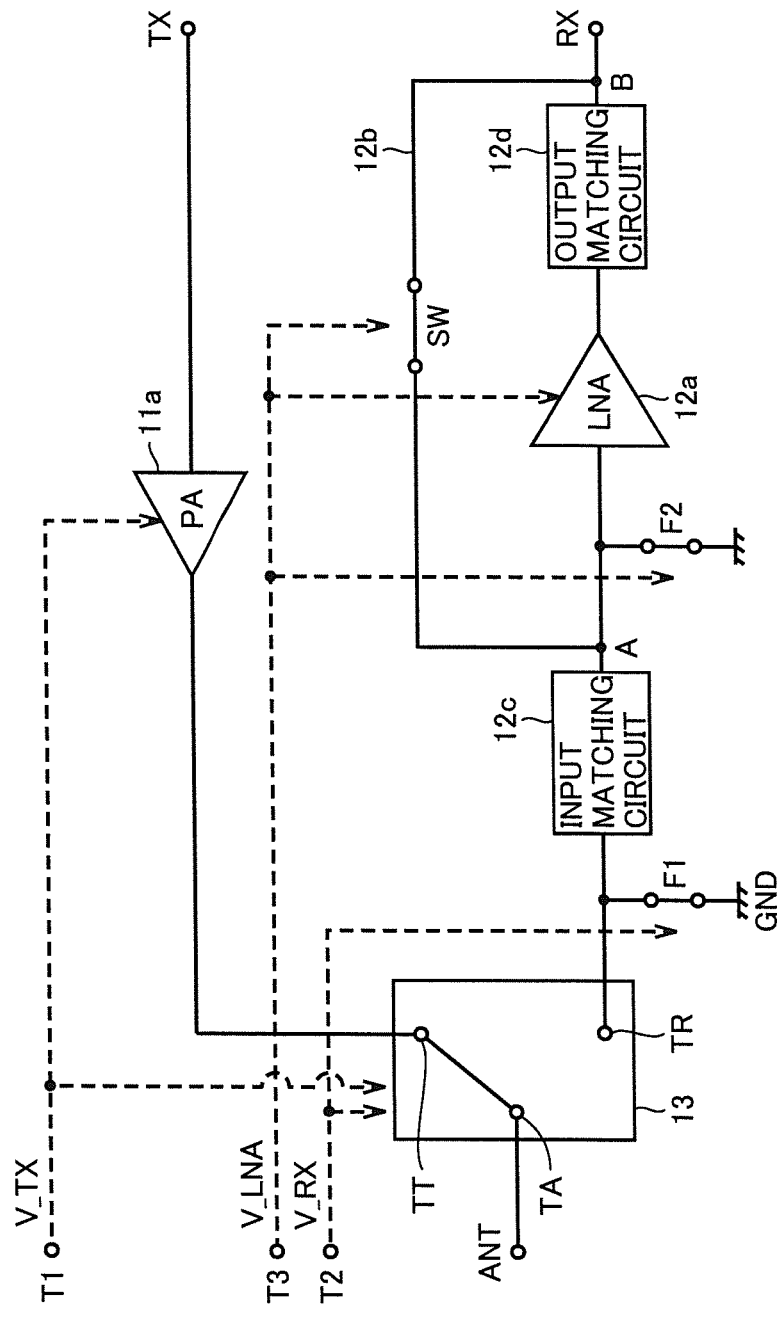
FIG. 10 is a circuit block diagram illustrating the configuration of a high frequency circuit according to a second embodiment of the present invention.

FIG. 10 is a circuit block diagram illustrating the configuration of a front-end circuit according to the second embodiment of the present invention. With reference to FIG. 10, in front-end circuit 20, attenuation circuit F1 (first attenuation circuit) is provided between antenna switch 13 and start point A, and attenuation circuit F2 (second attenuation circuit) is provided between start A and LNA 12a. Attenuation circuit F1 is wired to receive control signal V_RX. Attenuation circuit F2 is wired to receive control signal V_LNA.

In the second embodiment, one attenuation circuit is provided immediately before LNA 12a. Thereby, according to the second embodiment, especially in the case where the amplifier transistor included in LNA 12a is mainly responsible for causing a distortion to occur in the loopback signal, the distortion of the loopback signal can be reduced effectively.

Third Embodiment

The third embodiment is different from the second embodiment in the arrangement of the two attenuations. However, in the third embodiment, attenuation unit 14 includes two attenuation circuits provided at two positions, respectively, which is the same as the second embodiment.

Figure 11:
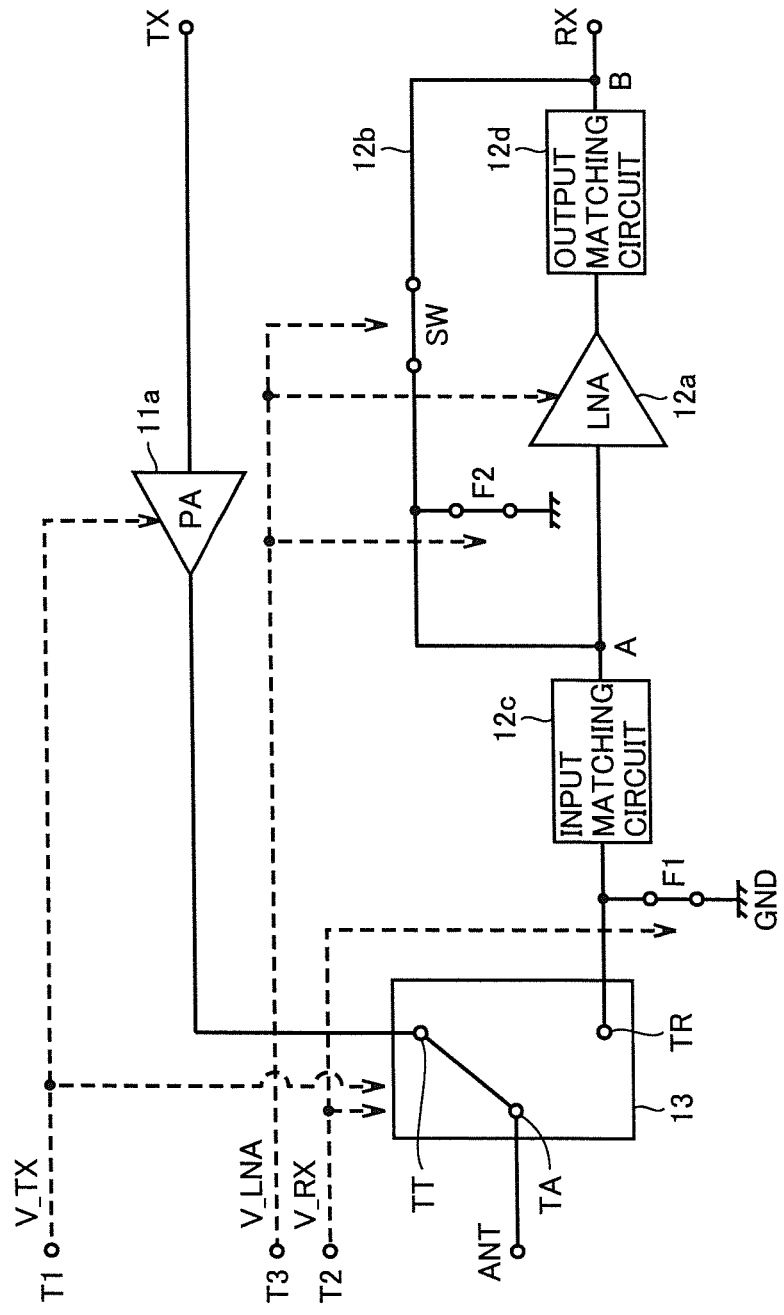
FIG. 11 is a circuit block diagram illustrating the configuration of a high frequency circuit according to a third embodiment of the present invention.

FIG. 11 is a circuit block diagram illustrating the configuration of a front-end circuit according to the third embodiment of the present invention. With reference to FIG. 11, in front-end circuit 30, attenuation circuit F1 (first attenuation circuit) is provided between antenna switch 13 and start point A, and attenuation circuit F2 (second attenuation circuit) is provided between start A and switch SW.

In the third embodiment, one attenuation circuit is provided immediately before switch SW. Thereby, according to the third embodiment, especially in the case where the switching transistor included in switch SW is mainly responsible for causing a distortion to occur in the loopback signal, the distortion of the loopback signal can be reduced effectively.

Fourth Embodiment

The fourth embodiment is different from the second and third embodiments in that the two attenuation circuits are provided at substantially the same position.

Figure 12:
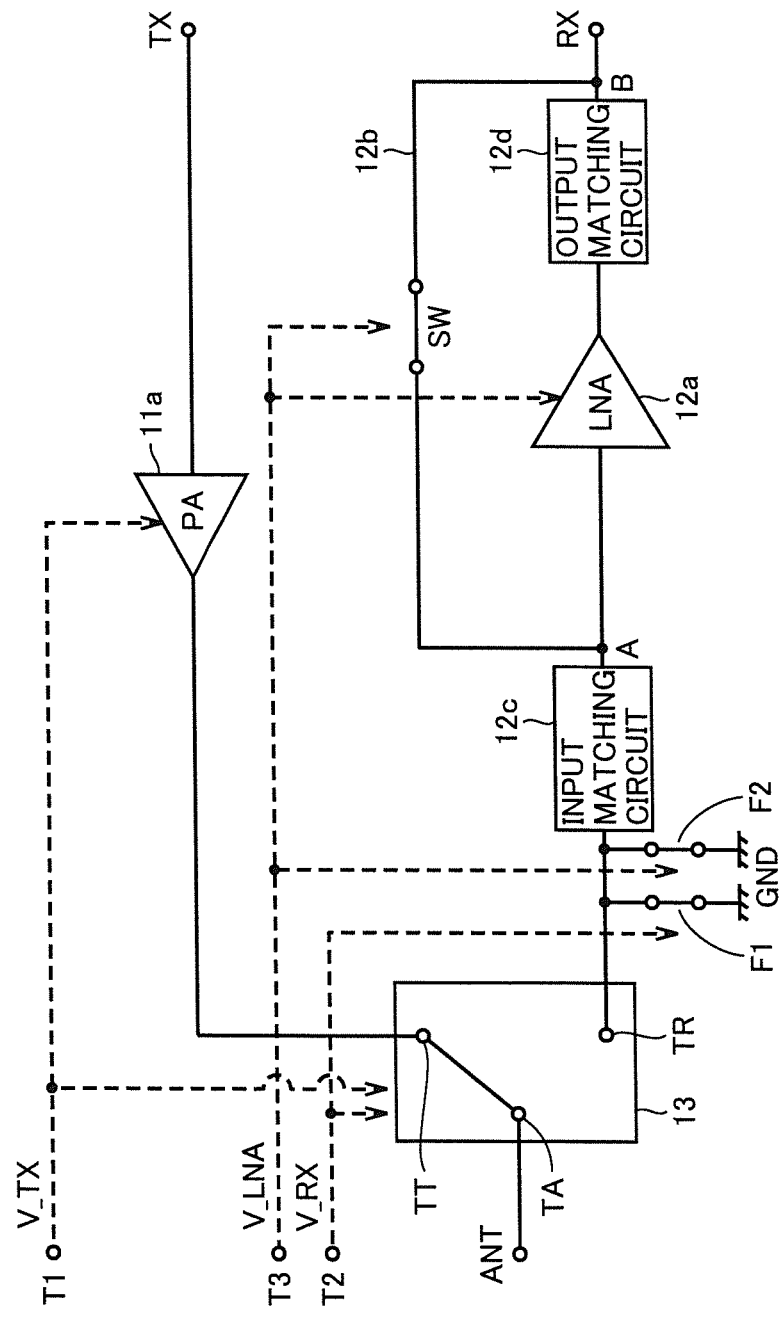
FIG. 12 is a circuit block diagram illustrating the configuration of a high frequency circuit according to a fourth embodiment of the present invention.

FIG. 12 is a circuit block diagram illustrating the configuration of a front-end circuit according to the fourth embodiment of the present invention. With reference to FIG. 12, in front-end circuit 40, both attenuation circuit F1 (first attenuation circuit) and attenuation circuit F2 (second attenuation circuit) are provided between antenna switch 13 and start point A.

In the fourth embodiment, the two attenuation circuits are provided between antenna switch 13 and start point A. According to the fourth embodiment, especially in the case where the amplifier transistor included in LNA 12a and the switching transistor included in switch SW cause a distortion to occur in the loopback signal at the same extent or it is not clear which transistor is mainly responsible for causing a distortion to occur in the loopback signal, the distortion of the loopback signal can be reduced effectively.

Fifth Embodiment

The fifth embodiment is different from the fourth embodiment in the arrangement of the two attenuation circuits which are provided at substantially the same position.

Figure 13:
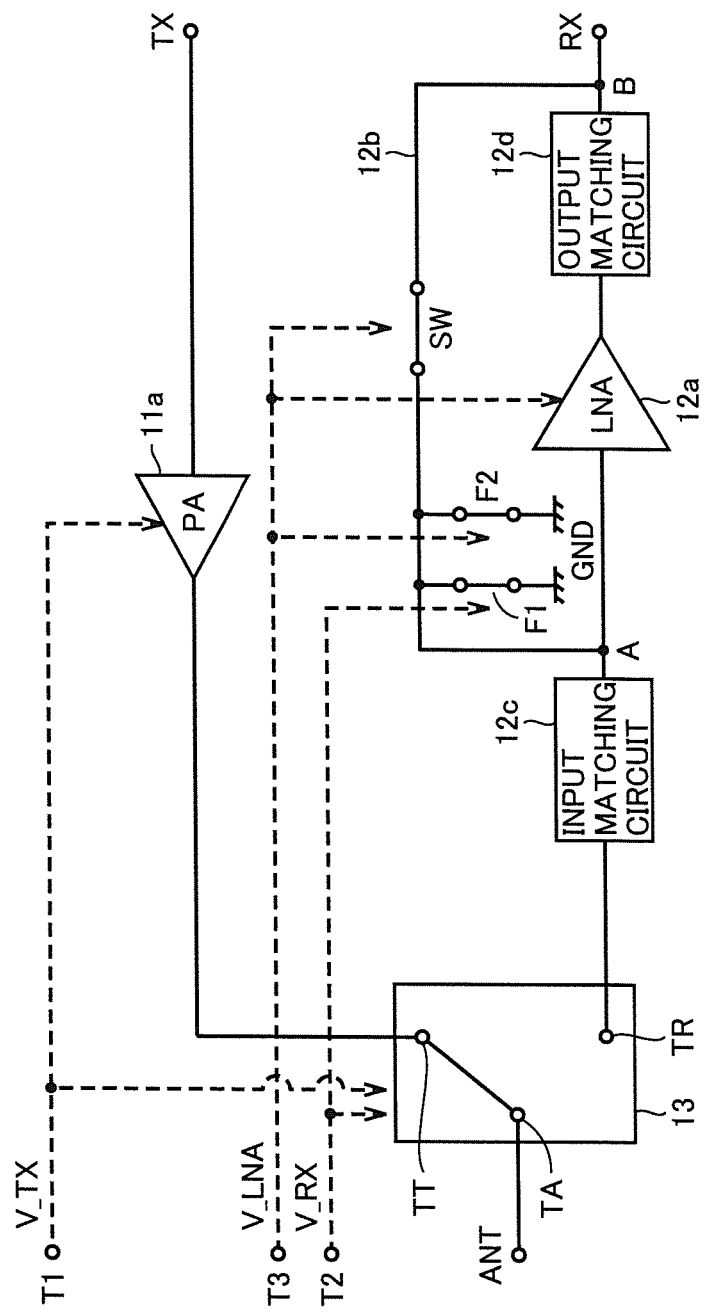
FIG. 13 is a circuit block diagram illustrating the configuration of a high frequency circuit according to a fifth embodiment of the present invention.

FIG. 13 is a circuit block diagram illustrating the configuration of a front-end circuit according to the fifth embodiment of the present invention. With reference to FIG. 13, in front-end circuit 50, both attenuation circuit F1 (first attenuation circuit) and attenuation circuit F2 (second attenuation circuit) are provided between start point A and switch SW.

Similar to front-end circuit 30 of the third embodiment, the two attenuation circuits are provided immediately before switch SW in the fifth embodiment. According to the fifth embodiment, especially in the case where the switching transistor included in switch SW is mainly responsible for causing a distortion to occur in the loopback signal, the distortion of the loopback signal can be reduced effectively. Further, in front-end circuit 50, no attenuation circuit is provided on the transfer line for transferring the reception signal to LNA 12a, and thereby, it is possible to inhibit the noise figure of LNA 12a from being deteriorated in the LNA mode.

Sixth Embodiment

The sixth embodiment is different from the fourth and fifth embodiments in the arrangement of the two attenuation circuits which are provided at substantially the same position.

Figure 14:
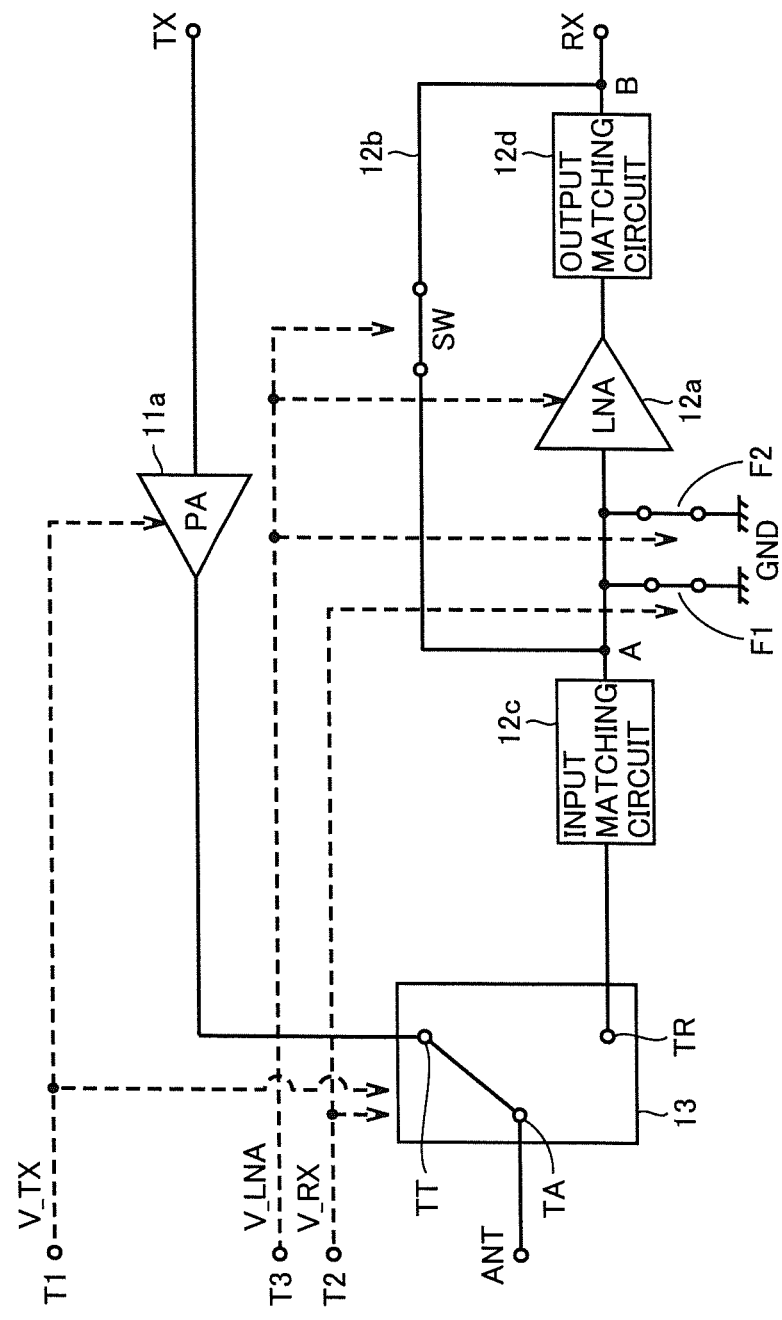
FIG. 14 is a circuit block diagram illustrating the configuration of a high frequency circuit according to a sixth embodiment of the present invention.

FIG. 14 is a circuit block diagram illustrating the configuration of a front-end circuit according to the sixth embodiment of the present invention. With reference to FIG. 14, in front-end circuit 60, both attenuation circuit F1 (first attenuation circuit) and attenuation circuit F2 (second attenuation circuit) are provided between start point A and LNA 12a.

Similar to front-end circuit 20 of the second embodiment, the two attenuation circuits are provided immediately before LNA 12a in the sixth embodiment. According to the sixth embodiment, especially in the case where the amplifier transistor included in LNA 12a is mainly responsible for causing a distortion to occur in the loopback signal, the distortion of the loopback signal can be reduced effectively.

Note that in front-end circuits 10, 20, 40, 60, there are two attenuation circuits provided on the transfer line for transferring the reception signal to LNA 12a, while in the front-end circuit 30, there is only one attenuation circuit. Therefore, compared to front-end circuits 10, 20, 40, 60, front-end circuit 30 can further inhibit the noise figure of LNA 12a from being deteriorated in the LNA mode.

[First Modification]

In the above, it is described that the attenuation circuit in each of the first to sixth embodiments has a configuration illustrated in FIG. 3. However, the configuration of the attenuation circuit is not limited thereto. Any attenuation circuit is acceptable as long as it is connected in parallel between the transfer line for transferring the high frequency signal and ground node GND, allowing the high frequency signal to escape to ground node GND. Hereinafter, an attenuation circuit according to a modification of the present invention having a modified configuration will be described. In the front-end circuit according to a modification of the present invention, the same reference numerals are assigned to components similar to those in attenuation circuit F1 illustrated in FIG. 3, and the description thereof will not be repeated. Further, since the control of the front-end circuit is also the same as that according to the first to sixth embodiments, the description thereof will not be repeated.

Figure 15:
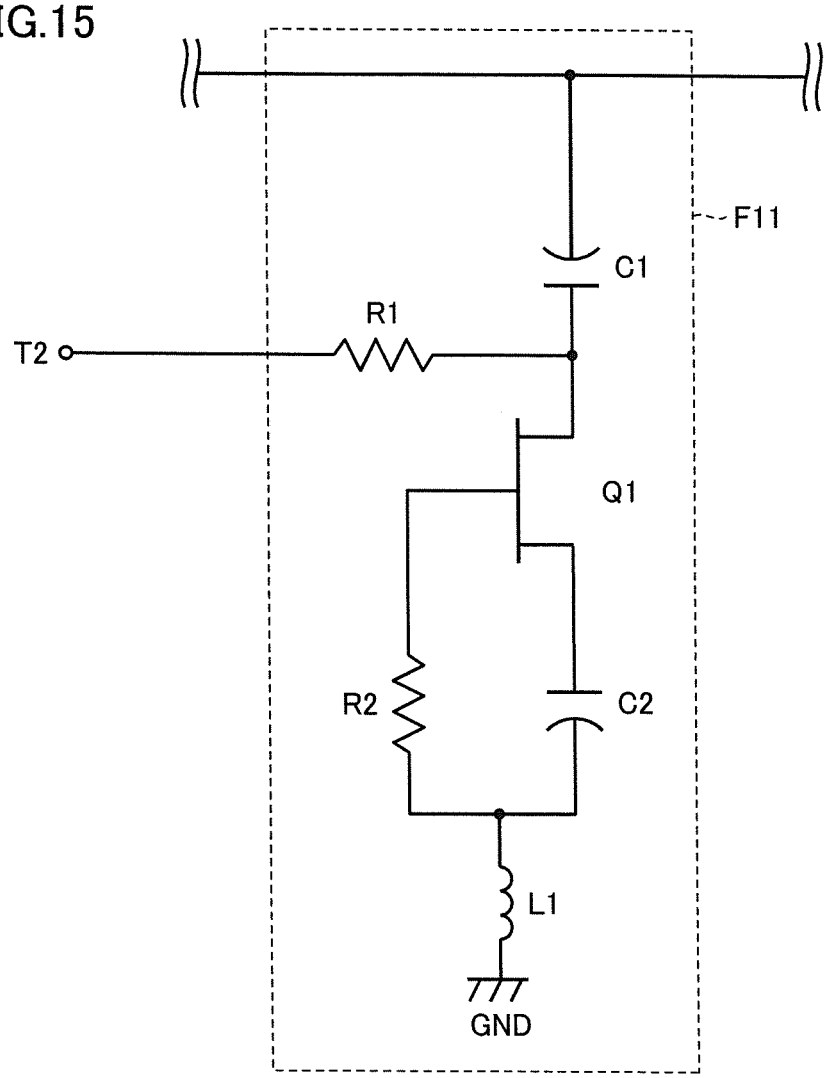
FIG. 15 is a circuit diagram illustrating the configuration of an attenuation circuit according to a first modification of the present invention.

FIG. 15 is a circuit diagram illustrating the configuration of an attenuation circuit according to the first modification of the present invention. With reference to FIG. 15, in attenuation circuit F11, an inductor L1 is provided between capacitor C2 close to the side of ground node GND and ground node GND. Thereby, an LC resonant circuit is formed from the capacitance of capacitor C2 and the inductance of inductor L1.

Hereinafter, the description will be carried out on the case where each of the attenuation circuits included in attenuation unit 14 has the same configuration as attenuation circuit F11 according to the first modification. In attenuation circuit F11, it is preferable to set the capacitance of capacitor C2 and the inductance of inductor L1 so that the frequency of the resonance point of the LC resonance circuit is located in the frequency band prescribed in IEEE 802.11ac. Thereby, it is possible to further attenuate the loopback signal in comparison to the case where the resonance point of the LC resonance circuit is located beyond the frequency band.

It is possible to flexibly adjust the dependence of isolation on frequency by utilizing the isolation feature that the change of attenuation is steep in the frequency band around the resonance point. For example, in the case where attenuation unit 14 includes two attenuation circuits each of which having the same configuration as attenuation circuit F11, it is preferable to set the capacitance of capacitor C2 and/or the inductance of inductor L1 of each of the two attenuation circuits so that the resonance point of one attenuation circuit is located in a frequency band higher than the frequency band and the resonance point of the other attenuation circuit is positioned in a frequency band lower than the frequency band. Thereby, it is possible to make the dependence of isolation on frequency flat in the frequency band. In other words, it is possible to achieve a front-end circuit of which the signal strength of a loopback signal does not depend on the transmission frequency.

As inductor L1, it is preferable to use a bonding wire for mounting the front-end circuit on the package. The use of the inductance of the bonding wire avoids the necessity of adding a new inductor. Thereby, it is possible to reduce the material cost. However, inductor L1 is not limited to a bonding wire. Inductor L1 may be, for example, a spiral inductor or a chip inductor, or a transfer line formed on a mounting substrate.

[Second Modification]

In the first modification, one inductor is provided for each of the attenuation circuits. However, the inductor may be provided in common for a plurality of attenuation circuits.

Figure 16:
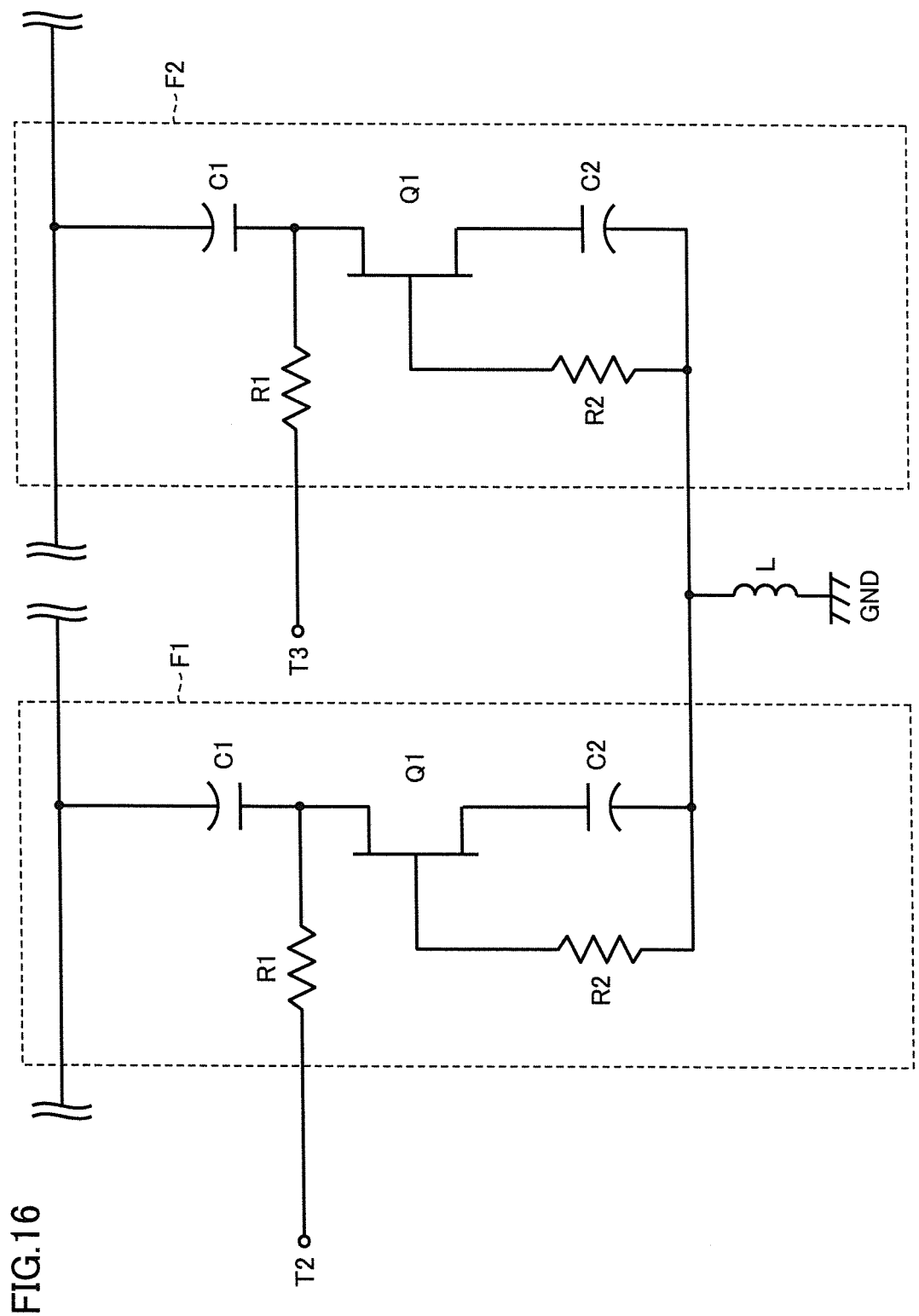
FIG. 16 is a circuit diagram illustrating the configuration of an attenuation unit according to a second modification of the present invention.

FIG. 16 is a circuit diagram illustrating the configuration of an attenuation unit according to the second modification of the present invention.

With reference to FIG. 16, capacitor C2 included in attenuation circuit F1 and capacitor C2 included in attenuation circuit F2 are connected to each other at the side close to ground node GND. The attenuation unit further includes an inductor L provided between the side close to the ground node and ground node GND. The arrangement and number of the attenuation circuits are similar to that of attenuation unit 14 provided in front-end circuit 20 according to the second embodiment.

The capacitance of capacitor C2 and the inductance of inductor L are set so that the resonance point of the attenuation circuit is positioned in the frequency band prescribed in IEEE 802.11ac. Thereby, similar to attenuation circuit F11 of the first modification, it is possible to flexibly adjust the dependence of isolation on frequency. According to the second modification, the number of inductor in the front-end circuit including the attenuation unit is less than that in the front-end circuit having two attenuation circuits F11 by one. Thereby, it is possible to reduce the material cost.

Compared to the front-end circuit having two attenuation circuits F11, in the front-end circuit including the attenuation unit according to the second modification, when the capacitance of two capacitors C2 are equal to each other, the Q value will decrease by an amount by which the inductance of the inductor decreases. Thus, the change of attenuation in the frequency band around the resonance point will become relatively moderate. Thereby, it is possible to make the dependence of isolation on frequency relatively flat. In a front-end circuit meeting the standards of IEEE 802.11ac, it is particularly effective since the frequency band is wide. From another viewpoint, since it is not necessary to increase the number of capacitor C2 or increase the size of capacitor C2 so as to reduce the Q value, it is possible to reduce the substrate area.

The front-end circuit is incorporated into a front-end module (high frequency module) and is mounted on a package. The description will be carried out on the case where the front-end circuit includes the attenuation unit according to the second modification.

Figure 17:
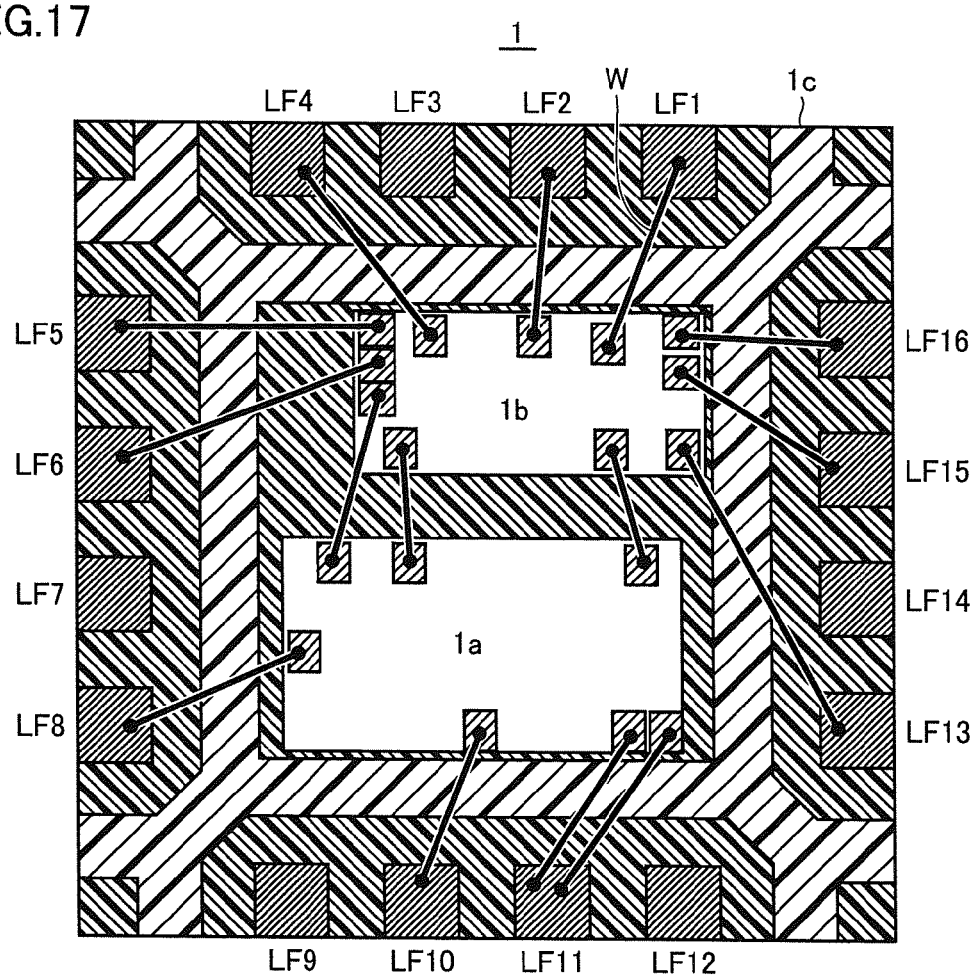
FIG. 17 is a schematic diagram illustrating the wiring of bonding wires inside a package in a high frequency module incorporated with a high frequency circuit including the attenuation unit illustrated in FIG. 16.
Figure 18:
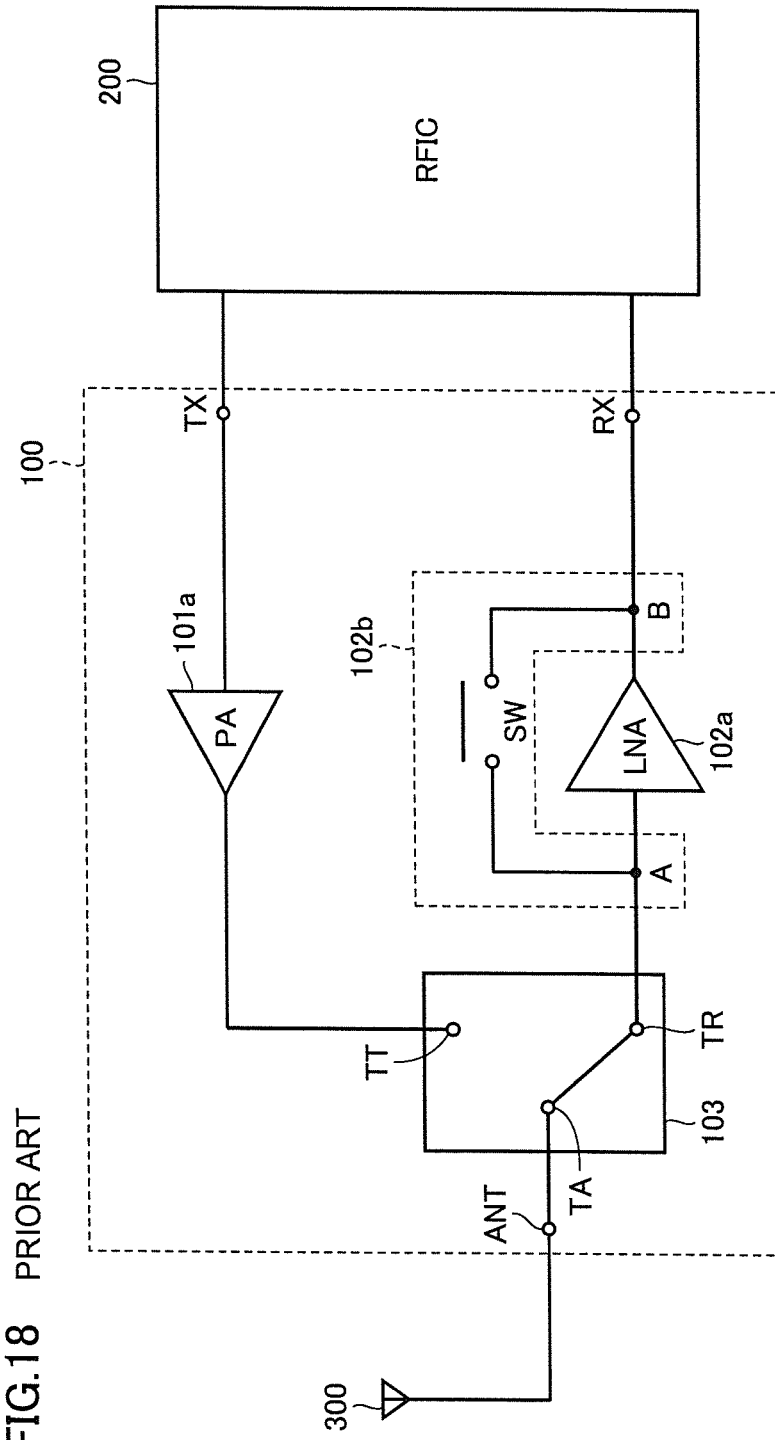
FIG. 18 is a circuit block diagram illustrating the configuration of a conventional high frequency circuit.
Figure 19:
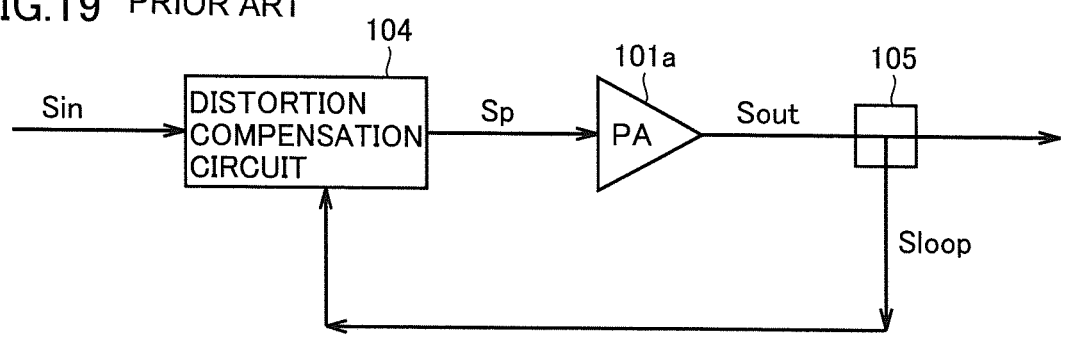
FIG. 19 is a block diagram illustrating the concept of a digital pre-distortion.
Figure 20:
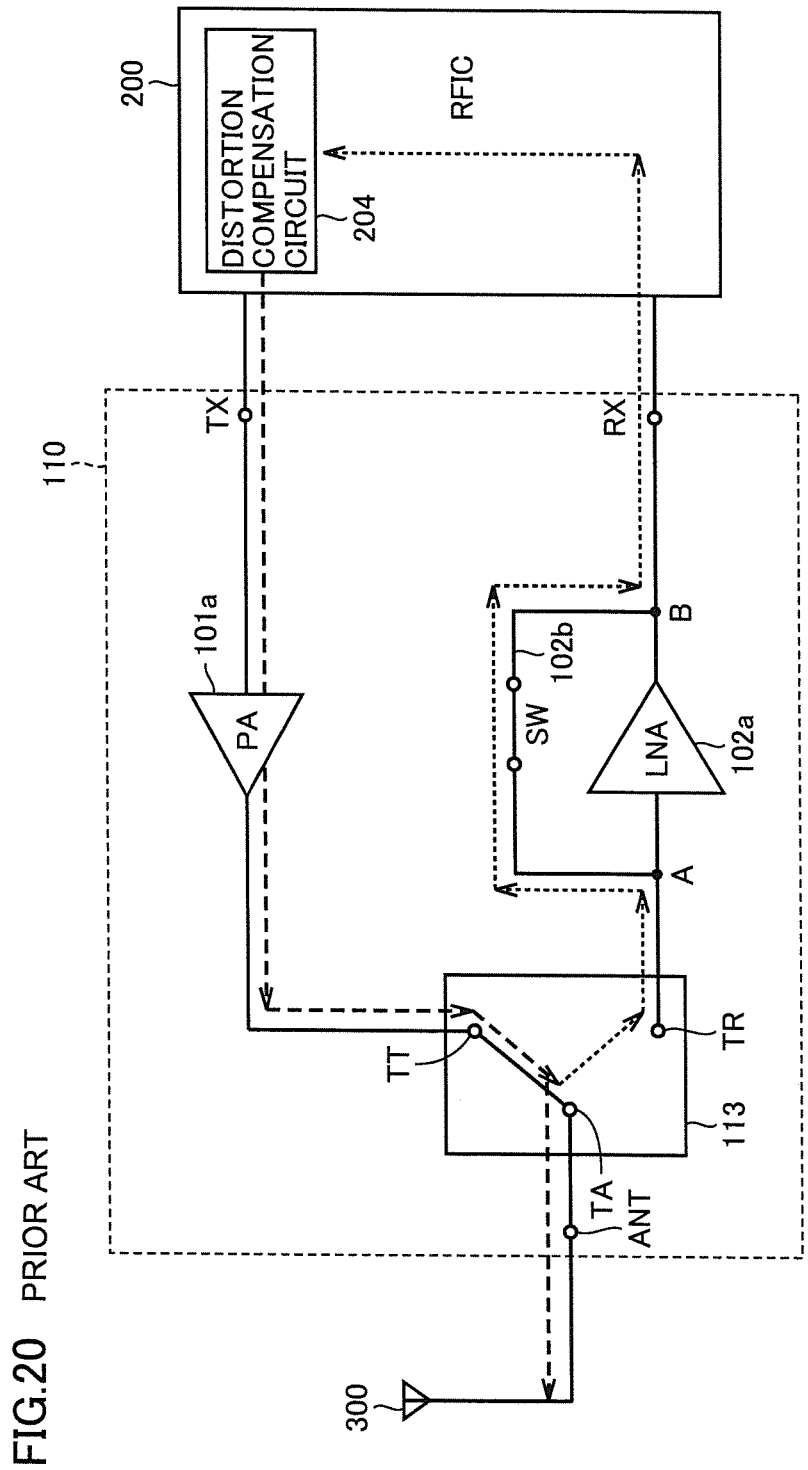
FIG. 20 is a circuit block diagram illustrating the configuration and a transfer line for transferring signals of a conventional high frequency circuit which uses the isolation feature of a connection switching circuit to branch a branch signal.

FIG. 17 is a schematic diagram illustrating the wiring of bonding wires inside a package in the front-end module incorporated with the front-end circuit including the attenuation unit illustrated in FIG. 16.

A front-end module 1 illustrated in FIG. 17 includes an HBT (Heterojunction Bipolar Transistor) substrate 1a, an HEMT (High Electron Mobility Transistor) substrate 1b, and a QFN (Quad Flat Non-leaded) package 1c. HBT substrate 1a and HEMT substrate 1b are both mounted inside QFN package 1c. Although not shown in the drawings for the purpose of simplicity, a PA 11a is formed on HBT substrate 1a, and LNA 12a and antenna switch 13 are formed on HEMT substrate 1b. The other components for the front-end circuit are also mounted inside QFN package 1c.

QFN package 1c is a substantially square, each side of which is 2.5 mm. QFN package 1c includes lead frames LF1 to LF16. As to be mentioned below, each lead frame of LF1 to LF16 is connected to a corresponding terminal or node through a bonding wire. Specifically, lead frame LF1 is connected to ground node GND. Lead frame LF2 is connected to reception terminal RX. Lead frame LF4 is connected to control terminal T3 for receiving control signal V_LNA. Lead frame LF6 is connected to control terminal T1 for receiving control signal V_TX. Lead frame LF8 is connected to transmission terminal TX. Lead frame LF13 is connected to antenna terminal ANT. Lead frame LF15 is connected to control terminal T2.

Among the bonding wires, a bonding wire W for connecting an electrode pad provided on HEMT substrate 1b to lead frame LF1 corresponds to inductor L illustrated in FIG. 16. It is possible to make fine adjustments to the inductance of inductor L by slightly changing the length of bonding wire W at the time of performing the wiring through using the bonding wire. Thus, it is possible to set the inductance of inductor L so as to locate the resonance point within a desired frequency band. Thereby, it is possible to flexibly adjust the dependence of isolation on frequency. Instead of the bonding wire, inductor L may be provided separately as a spiral inductor, a chip inductor or a transfer line.

Although the front-end circuit including the attenuation unit according to the second modification has been described as being mounted to QFN package 1c, the front-end circuit according to each of the first to sixth embodiments can also be mounted to QFN package 1c in a similar manner. The circuit to be mounted to QFN package 1c is not limited to the front-end circuit of each of the first to sixth embodiments and the components thereof. QFN package 1c may include another circuit used in data communication via wireless LAN.

HBT substrate, HEMT and QFN package are illustrative only, and the types of the substrate and the package are not limited thereto.

IEEE 802.11ac has been used as an example, and however it is merely used to illustrate wireless communication. The present invention is not limited to be applied to a front-end circuit in wireless LAN compatible with the 5 GHz band, it is also applicable to the 2.4 GHz band. The same effects can also be obtained in the 2.4 GHz band. Furthermore, the wireless communication is not limited to a wireless LAN prescribed in the IEEE 802.11 standards.

In the first to sixth embodiments, input matching circuit 12c is provided between antenna switch 13 and start point A. However, input matching circuit 12c may be provided at any position between antenna switch 13 and LNA 12a. In other words, input matching circuit 12c may be provided between start point A and LNA 12a. Further, in front-end circuit 10 illustrated in FIG. 1, attenuation circuit F1 is provided between terminal TR and input matching circuit 12c. However, the attenuation circuit may be located before or after input matching circuit 12c. In other words, attenuation circuit F1 may be provided between input matching circuit 12c and start point A.

Antenna switch 13 has been specifically illustrated as a connection switching circuit, it is acceptable to use a duplexer which is compatible with the wireless LAN to replace antenna switch 13. Antenna switch 13 is not limited to a switch of SPDT type. Antenna switch 13 may be a higher-grade switch such as a switch of SP3T (Single Pole Triple Throw) type or a switch of SP4T (Single Pole Quadruple Throw) type.

It has been described that RFIC 200 includes distortion compensation circuit 204, but it is not limited thereto. The distortion compensation circuit may be included in an external circuit different from RFIC 200.

Furthermore, the use of a branch signal partially branched from the transmission signal is not necessarily limited to the case of applying DPD. The compensation for the variation of various features of PA 11a caused by the temperature changes or the antenna impedance changes on the basis of a voltage (or power) of a branch signal is being performed in a wide range without being limited in DPD. When the gain is varied, it is possible to use a branch signal to increase or decrease the power to be input to PA 11a or a control voltage of a bias circuit of PA 11a so as to maintain the gain constant.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST 10, 20, 30, 40, 50, 60, 100, 110: front-end circuit; 11a, 101a: PA; 12a, 102a: LNA12; 12b, 102b: bypass circuit; SW: switch; 12c: input matching circuit; 12d: output matching circuit; 13, 103, 113: antenna switch; TA, TT, TR: terminal; 104, 204: distortion compensation circuit; 200: RFIC; 300: antenna; 400: control circuit; 14: attenuation unit; F1, F2, F3, F11: attenuation circuit; A: start point; B: end point; TX: transmission terminal; RX: reception terminal; ANT: antenna terminal; T1, T2, T3: control terminal; V_TX, V_RX, V_LNA: control signal; Sin: input signal; Sout: output signal; Sp: distortion compensation signal; S_loop: loopback signal; S_TX: transmission signal; S_RX: reception signal; Q1: switching element; C1, C2: capacitor; R1, R2: resistor; 1: front-end module; 1a: HBT substrate; 1b: HEMT substrate; 1c: QFN package; LF1, LF2, LF3, LF4, LF5, LF6, LF7, LF8, LF9, LF10, LF11, LF12, LF13, LF14, LF15, LF16: lead frame; W: bonding wire; 7a, 7b, 8a, 8b, 9a, 9b: waveform

The invention claimed is:
1. A high frequency circuit comprising:
a power amplifier circuit configured to amplify a signal received by a signal transmission terminal and output it as a transmission signal;
a low noise amplifier circuit configured to amplify a reception signal received by an antenna terminal and output said reception signal after amplification to a reception terminal;
a connection switching circuit configured to switch a connection between said antenna terminal and said power amplifier circuit and a connection between said antenna terminal and said low noise amplifier circuit in response to a first control signal;
a bypass circuit configured to form a bypass between said connection switching circuit and said reception terminal to bypass said low noise amplifier circuit in response to a second control signal; and
an attenuation unit provided on a transfer line for transferring said reception signal,
said attenuation unit including a plurality of attenuation circuits,
said plurality of attenuation circuits including
a first attenuation circuit configured to attenuate a branch signal leaked from said transmission signal into the transfer line for transferring said reception signal in response to said first control signal in the case where said antenna terminal is electrically connected to said power amplifier circuit by said connection switching circuit, and
a second attenuation circuit configured to attenuate said reception signal in said transfer line in response to said second control signal in the case where said antenna terminal is electrically connected to said low noise amplifier circuit by said connection switching circuit,
said second attenuation circuit attenuating said branch signal together with said first attenuation circuit in response to said second control signal in the case where said antenna terminal is electrically connected to said power amplifier circuit by said connection switching circuit.
2. The high frequency circuit according to claim 1, wherein said bypass circuit includes a switch responsive to said second control signal and is configured to form said bypass from a start point provided between said connection switching circuit and said low-noise amplifier circuit, and
each of said plurality of attenuation circuits is provided between said connection switching circuit and said start point or between said start point and said switch or between said start point and said low noise amplifier circuit.
3. The high frequency circuit according to claim 2, wherein each of said plurality of attenuation circuits includes a switching element provided between said transfer line and a ground node, and
said switching element electrically connects said transfer line to said ground node in response to a corresponding signal of said first and second control signals.
4. The high frequency circuit according to claim 1, wherein each of said plurality of attenuation circuits includes a switching element provided between said transfer line and a ground node, and
said switching element electrically connects said transfer line to said ground node in response to a corresponding signal of said first and second control signals.

5. The high frequency circuit according to claim 4, wherein
said switching element is an FET (Field Effect Transistor),
each of said plurality of attenuation circuits further includes a resistor provided between the gate of said FET and said ground node, a first capacitor provided between the drain of said FET and said transfer line, and a second capacitor provided between the source of said FET and said ground node, and
the drain of said FET receives a corresponding signal of said first and second control signals.

6. The high frequency circuit according to claim 5, wherein each of said plurality of attenuation circuits further includes an inductor provided between said second capacitor and said ground node.

7. The high frequency circuit according to claim 6, wherein said inductor is a bonding wire for mounting said high frequency circuit on a package.

8. The high frequency circuit according to claim 5, wherein
said second capacitors provided respectively in at least two of said plurality of attenuation circuits are connected to each other at the side of said ground node, and
said attenuation unit further includes an inductor provided between the side of the ground node where said second capacitors are connected to each other and said ground node.

9. The high frequency circuit according to claim 8, wherein said inductor is a bonding wire for mounting said high frequency circuit on a package.

10. The high frequency circuit according to claim 2, wherein
said plurality of attenuation circuits further include a third attenuation circuit configured to attenuate said branch signal together with said first attenuation circuit in response to said first control signal,
said first attenuation circuit is provided between said connection switching circuit and said start point,
said second attenuation circuit is provided between said start point and said low noise amplifier circuit, and
said third attenuation circuit is provided between said start point and said switch.

11. The high frequency circuit according to claim 2, wherein
said first attenuation circuit is provided between said connection switching circuit and said start point, and
said second attenuation circuit is provided between said start point and said low noise amplifier circuit.

12. The high frequency circuit according to claim 2, wherein
said first attenuation circuit is provided between said connection switching circuit and said start point, and
said second attenuation circuit is provided between said start point and said switch.

13. The high frequency circuit according to claim 2, wherein said first and second attenuation circuits are provided between said connection switching circuit and said start point.

14. The high frequency circuit according to claim 2, wherein said first and second attenuation circuits are provided between said start point and said switch.

15. The high frequency circuit according to claim 2, wherein said first and second attenuation circuits are provided between said start point and said low noise amplifier circuit.

16. A high frequency module comprising the high frequency circuit according to claim 1.

17. The high frequency module according to claim 16, wherein
said high frequency module further includes a distortion compensation circuit configured to receive from said reception terminal said branch signal attenuated by said first attenuation circuit, and
said distortion compensation circuit reduces the distortion of said transmission signal on the basis of said attenuated branch signal before outputting it to said transmission terminal, and outputs said transmission signal after reducing the distortion thereof to said transmission terminal.

18. The high frequency module according to claim 16, wherein said high frequency module further includes
an HBT (Heterojunction Bipolar Transistor) substrate on which said power amplifier circuit is provided,
an HEMT (High Electron Mobility Transistor) substrate on which said low noise amplifier circuit and said connection switching circuit are provided, and
a QFN (Quad Flat Non-leaded) package on which said high frequency circuit is mounted.

* * * * *